United States Patent
Kuijk et al.

(10) Patent No.: US 6,211,701 B1
(45) Date of Patent: Apr. 3, 2001

(54) LOW POWER LINE SWITCHING CIRCUIT, DEVICE AND METHOD

(75) Inventors: Maarten Kuijk, Berchem-Antwerp; Johan Stiens; Roger Andre Vounckx, both of Brussels; Frédérick Devisch, St.-Genesius-Rode, all of (BE)

(73) Assignee: Rose Research, LLC, Dallas, TX (US)

( * ) Notice: Subject to any disclaimer, the term of this patent is extended or adjusted under 35 U.S.C. 154(b) by 0 days.

(21) Appl. No.: 09/111,532

(22) Filed: Jul. 8, 1998

Related U.S. Application Data

(63) Continuation-in-part of application No. 08/767,193, filed on Dec. 16, 1996, now abandoned.

(51) Int. Cl.$^7$ .................. H03K 19/0175; H03K 19/094
(52) U.S. Cl. ............................ 326/83; 326/82; 326/80; 323/290; 327/111
(58) Field of Search .................. 326/83, 82, 81, 326/80, 17, 18, 19, 20, 26, 56, 57, 58; 327/333, 544, 415, 111, 110; 323/290, 282

(56) References Cited

U.S. PATENT DOCUMENTS

| | | | | |
|---|---|---|---|---|
| 4,291,240 | * | 9/1981 | Rosler ................................ | 307/262 |
| 4,370,570 | * | 1/1983 | Dash et al. ......................... | 307/270 |
| 4,613,771 | * | 9/1986 | Gal ..................................... | 307/443 |
| 5,744,943 | * | 4/1998 | Tokai .................................. | 323/282 |
| 5,754,011 | * | 5/1998 | Trus et al. .......................... | 315/209 |
| 5,883,505 | * | 3/1999 | Magazzu et al. .................. | 323/282 |
| 5,929,620 | * | 7/1999 | Dobkin et al. ..................... | 323/288 |

FOREIGN PATENT DOCUMENTS

| | | | |
|---|---|---|---|
| 0 395 146 A1 | 10/1990 | (EP) . | |
| 0 680 148 A2 | 11/1995 | (EP) . | |
| 62029312 | * 2/1987 | (JP) ................................... | 327/544 |
| WO 97/09783 | 3/1997 | (WO) . | |

OTHER PUBLICATIONS

IEEE Journal of Solid State Circuits, "A 500–Megabyte/s Data–Rate 4.5M DRAM," vol. 28, No. 4, Apr. 1993, pp. 490–498.

IEEE Journal of Solid State Circuits, "An Asymptotically Zero Power Charge–Recycling Bus Architecture for Battery–Operated Ultrahigh Data Rate ULSI's," vol. 30, No. 4, Apr. 1995, pp. 423–431.

IEEE Journal of Solid State Circuits, "Data–Dependent Logic Swing Internal Bus Architecture for Ultralow–Power LSI's," vol. 30, No. 4, Apr. 1995, pp. 397–402.

Seitz et al., "Hot Clock nMOS", 1985 Chapel Hill Conference on VLSI, pp. 1–17.

"An Asymptotically Zero Power Charge–Recycling Bus Architecture for Batter–Operated Ultrahigh Data Rate UlSI's", Yamauchi et al, IEEE Journal of Solid State Circuits; vol. 30, No. 4; Apr. 1995, pp. 423–431.*

"Data–Dependent Logic Swing Internal Bus Architecture for Ultralow–Power LSI's," Hiraki, et al.; IEEE Journal of Solid State Circuits; vol. 30, No. 4; Apr. 1995, pp. 397–402.*

"A 500 Megabyte/s Data–Rate 4.5M DRAM," Kushiyama, et al.; IEEE Journal of Solid State Circuits; vol. 28, No. 4; Apr. 1993, pp. 490–498.*

* cited by examiner

Primary Examiner—Michael Tokar
Assistant Examiner—Daniel D. Chang
(74) Attorney, Agent, or Firm—Slater & Matsil, LLP

(57) ABSTRACT

A drive circuit comprises an output terminal for connection to a signal line 1002. An inductor 1012 is coupled between the signal line 1002 and a reference voltage node 1010. A switch 1008 is coupled between the signal line 1002 and the reference voltage node 1010. When the switch 1008 is closed, the inductor 1012 is coupled between the reference voltage node 1010 and the signal line 1002. When the switch is open, the inductor 1012 is not coupled between the reference voltage node 1010 and the signal line 1002.

49 Claims, 16 Drawing Sheets

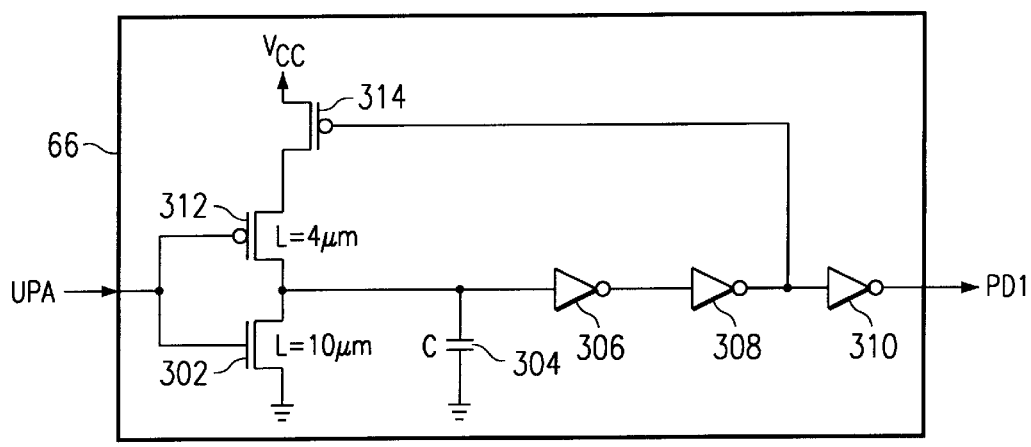
FIG. 15
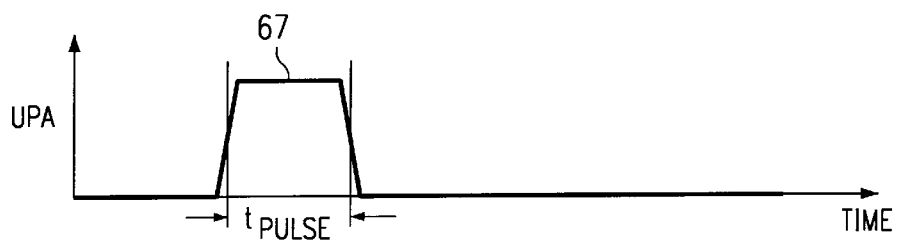
FIG. 16
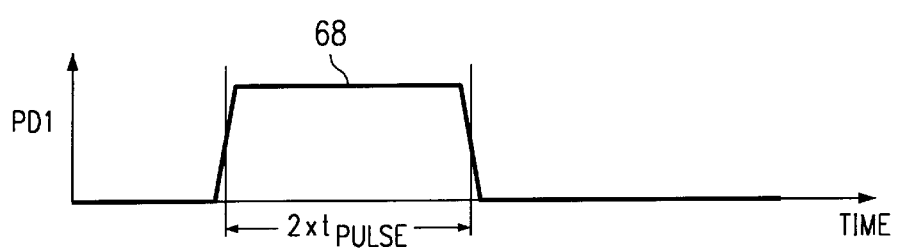
FIG. 17
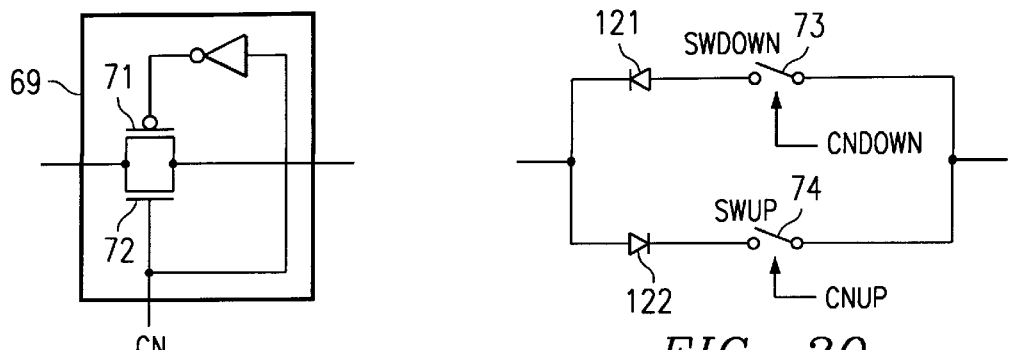
FIG. 18
FIG. 20

LOW POWER LINE SWITCHING CIRCUIT, DEVICE AND METHOD

This is a continuation-in-part of U.S. patent application Ser. No. 08/767,193, filed Dec. 16, 1996 now abandoned. The parent application Ser. No. 08/767,193 is incorporated herein by reference.

FIELD OF THE INVENTION

This invention relates generally to drive circuitry and more specifically to a low power switching circuit that can also reduce ground bouncing.

BACKGROUND OF THE INVENTION

Advances in the fields of computing, communications and consumer electronics have created conflicting requirements for electronic devices. On one hand, significantly increased data bandwidth is necessary for applications such as three-dimensional (3-D) computer graphics, high-definition moving pictures and high quality voice and information communications. On the other hand, the emergence of portable computers, telephones and other electronic devices and so-called green standards for personal computers has driven the need for reduced power consumption.

High bandwidth data processing is accomplished through use of multiple parallel data lines at increasingly higher frequencies. Power consumption and ground bounce, however, increase with the number of switching lines and also increase with augmentations in the operating frequency of the lines. Hence, a need exists to provide interface circuits for providing a high data bandwidth while reducing ground bounce and minimizing the power dissipated by the signal lines.

Several arrangements have been proposed for lowering the power dissipated when driving a high number of parallel lines. For example, Yamauchi et al., "An Asymptotically Zero Power Charge-Recycling Bus Architecture for Battery-Operated Ultrahigh Data Rate ULSI's", IEEE Journal of Solid-State Circuits, Vol.30, No. 4, April 1995, p.423, explain how energy dissipation can be lowered by reducing the voltage swing of the data lines. The swing of the lines is reduced by a given factor to achieve this. In an article by Hiraki et al. "Data-Dependent Logic Swing Internal Bus Architecture for Ultra low-Power LSI's", IEEE Journal of Solid-State Circuits Vol. 30, No. 4, April 1995, p.397, the reduction in the logic swing depends on the data passed through the bus.

Both systems use reduction of the voltage swing to obtain lower power dissipation when driving lines. The drawbacks of these systems are two-fold. First, bit-error rate (BER) increases at the receiving side due to reduced noise margins. Also, these systems are not fully compatible with existing data buses. Moreover, at the receiver side(s) the circuitry needs to be adapted to the specific proposed signaling methods. Neither of these papers teaches a backward compatible, voltage-independent and data pattern independent method for reducing data bus power consumption.

Additionally, in high-speed circuits the conventional capacitive model of a data line must be replaced by a transmission line model. Consequently, data transmission via conventional driver interfaces is impossible because of the large signal distortion due to reflections inherent in the open transmission line scheme. Hence a need exists to provide interface circuitry compatible with both capacitive and transmission lines.

Another problem associated with prior art devices is ground bounce caused by simultaneous switching of multiple lines. This noise in power lines originates from the fast transient current in the package and printed circuit board (PCB) parasitic inductances. Ground bounce also causes under- and overshoots outside the allowed voltage swings of the lines. On many integrated circuits, a large number of input/output (I/O) pins are used for power and ground leads. This ensures a low inductance path to the power supply lines and hence reduces ground bounce.

Several arrangements have been proposed for lowering the ground bounce in order to reduce the number of power and ground I/O pins. For example, papers have been published by C. S. Choy et al., "A Low Power-Noise Output Driver with an Adaptive Characteristic Applicable to a Wide Range of Loading Conditions," IEEE Journal of Solid-State Circuits, Vol. 32, No. 6, June 1997, p.913 and Thaddeus J. Gabara et al., "Forming Damped LRC Parasitic Circuits in Simultaneously Switched CMOS Output Buffers, IEEE Journal of Solid-State Circuits, Vol. 32, No. 3, March 1997, p.407). None of these alternatives, however, reduces power switching dissipation of switching lines. In fact, several even increase power consumption.

SUMMARY OF THE INVENTION

In one aspect, the present invention is directed toward a novel apparatus and method for changing the voltage level on a line with reduced power dissipation. The energy is reduced without significantly lowering the voltage swing and/or sacrificing noise margins. Alternatively, the invention can also be used in combination with a reduced voltage swing to achieve even lower power dissipation.

In another aspect, the present invention is directed toward a novel apparatus and method for switching a line with reduced ground bounce.

In one embodiment, a drive circuit comprises an output terminal for connection to a signal line. An inductor is coupled between the signal line and a reference voltage node. A switch is coupled between the signal line and the reference voltage node. When the switch is closed, the inductor is coupled between the reference voltage node and the signal line. When the switch is open, the inductor is not coupled between the reference voltage node and the signal line.

In another embodiment, a method of switching a line from a first voltage level to a second voltage level is disclosed. A signal line is inductively coupled to a reference voltage. The reference voltage being held at a level between the first and second voltage levels. The line is then decoupled from the reference voltage when the line substantially reaches a maximum bias relative to the reference voltage. After decoupling the line, the line is forced to the second voltage level. In one aspect, capacitive energy stored with a first charging direction on the signal line is converted into magnetic energy or magnetic energy is converted into capacitive energy on the signal line.

In yet another embodiment, a switching circuit includes a first switch with a current path coupled between a virtual ground node and an output node. The circuit also includes a second switch with a current path coupled between a HIGH voltage node and the output node and a third switch with a current path coupled between a LOW voltage node and the output node. In response to the receipt of an input signal, a control circuit enables the first switch for a selected period of time and, after the selected period of time, disables the first switch and enables only one of the second and third switches.

The present invention has a number of advantages over prior art switching circuits. For example, power dissipation and ground bounce can be reduced. The preferred embodiment of the invention also allows for a system that snaps the voltage of the lines to one of the allowed voltage levels and provides low output impedance. The values of the allowed voltage levels car be pre-defined. For example, in the preferred embodiment, these voltage levels are standard voltages such as 0 volts and 3.3 volts or 5 volts. Use of standard voltages makes the devices backwards compatible.

The preferred embodiment also permits for a means to estimate the end-of-conversion moment during the state changes.

Additionally, the preferred embodiments of the invention may also be used to switch transmission lines.

The above and further advantages and features of the invention will be more fully apparent from the following detailed description with accompanying drawings.

BRIEF DESCRIPTION OF THE DRAWINGS

The above features of the present invention will be more clearly understood from consideration of the following descriptions in connection with accompanying drawings in which:

FIG. 15 schematically illustrates a pulse doubler circuit.

FIG. 16 is a timing diagram for signal UPA.

FIG. 17 is a timing diagram for signal PD1.

FIG. 18 is a schematic diagram of a first preferred integrated circuit switch.

FIG. 20 is a schematic diagram of a third preferred integrated circuit switch with integral diodes.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

The following description explains in detail a low power circuit for switching data lines with a HIGH level and a LOW level. The invention will be described with respect to the figures which show two specific embodiments. Variations and other embodiments will also be described.

Before turning to the figures, however, it will be useful to briefly review the concept of the preferred embodiment. According to the first preferred embodiment of the present invention, a line is driven from one voltage level to another voltage level by connecting it to a mid-level voltage through an inductive energy storage element. Energy stored in capacitive form on the line is transferred to the inductive energy storage element, and flows back to the line to charge the line in the opposite direction to a voltage very near to the second voltage level. A snap system may also be employed to snap the voltage level of the line to the nearest allowed voltage level.

Figure 36:
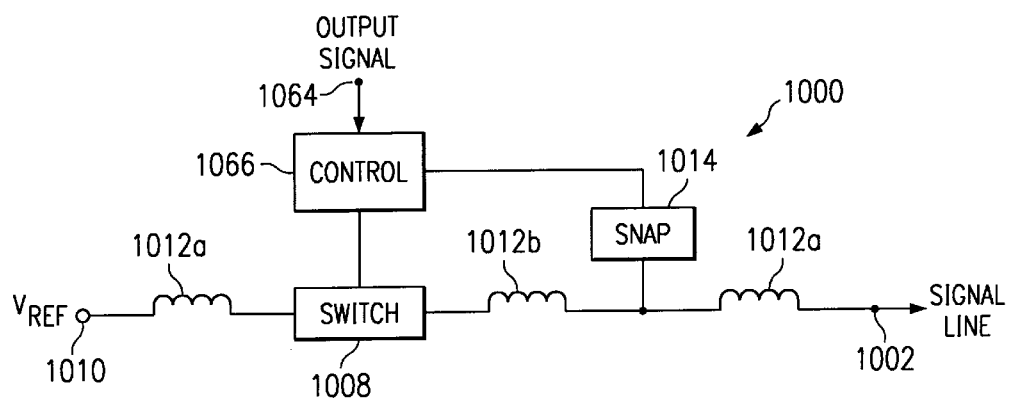
FIG. 36 is a block diagram of a switching circuit of the present invention.

To illustrate the general concept of this embodiment, reference should be made to the last figure. FIG. 36 shows a drive circuit 1000 which can operate with substantially less power consumption than conventional drive circuits. One goal of the circuit 1000 is to drive the signal line 1002 in accordance with the level of output signal 1004. To accomplish this goal, output signal 1004 is provided to control circuitry 1006. The control circuitry will turn on switch 1008. When switch 1008 is closed (i.e., conductive), a series circuit is formed between reference voltage node 1010, inductor 1012 and signal line 1002. When switch 1008 is open (i.e., non-conductive), a series circuit is prevented from being formed between the reference voltage node 1010, inductor 1012 and signal line 1002.

In FIG. 36, inductor 1012 is illustrated as three separate inductors 1012a, 1012b, and 1012c. Different embodiments of the invention can utilize all, some or one of the inductors 1012 as will become clear from the discussions below. In this aspect of the invention, the only question is whether the inductor is coupled between the reference node 1010 and signal line 1002 for the appropriate amount of time. Specific details of the design are provided in the examples provided below.

FIG. 36 also illustrates a snap circuit 1014. The snap circuit is optional and provided to force the signal line 1002 to the full voltage level and maintain it at that level. Once again, specific embodiment snap circuits are provided below. While different snap circuits are discussed with respect to specific embodiments, it should be understood that these elements may be interchanged. In other words, the snap circuit included in the embodiment illustrated in FIG. 30 could be used in the embodiment of FIG. 7.

In a typical embodiment, signal line 1002 is formed on a printed circuit board while the drive circuitry 1000 is formed in an integrated circuit mounted to the printed circuit board. This arrangement is not required. For example, signal line 1002 could be integrated with drive circuit 1000 or integrated with a receiver circuit (not shown). Throughout the following discussion, signal line 1002 is often referred to as a data line. Signal line 1002 could alternatively be another type of line such as a control line or an address line. While the term "data line" is used throughout this discussion, it should be understood that the invention applies equally to other signal lines as well.

In the description, the HIGH level voltage is essentially equal to the voltage of the high power supply voltage $V_{CC}$. In particular embodiments this voltage may be about 5 volts, about 3.3 volts or about 2.5 volts, as examples. In general, the value of the $V_{CC}$ voltage is determined by other factors on the particular integrated circuit and/or system and is not critical to the present invention. The LOW level is essentially the voltage of the low power supply voltage (e.g., ground level or 0 volts). A person skilled in the art can extend the system to other voltage levels, or even to multi-value or multi-level bus systems. These pre-defined levels are further included in the allowed voltage levels.

Figure 1:
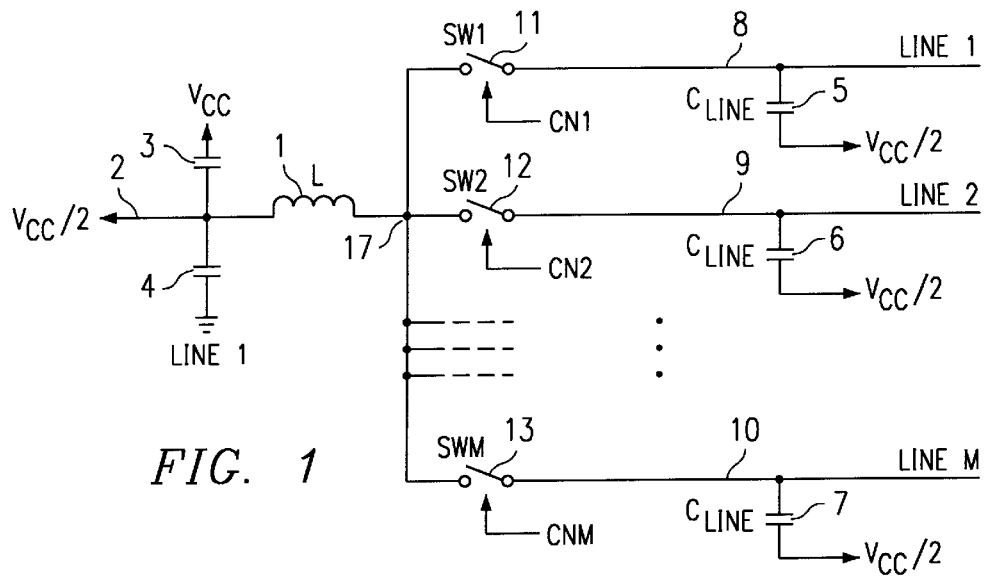
FIG. 1 is a schematic diagram of a first preferred voltage switching circuit.

FIG. 1 illustrates a first preferred circuit for switching data lines. The elements of FIG. 1 could be implemented in the bus driving circuitry of a microprocessor, a peripheral or graphics controller, a memory device, or other device that communicates data through signal lines such as an ISA, PCI, VL, SCSI or other well known bus architecture. In that instance, data lines 8,9 . . . 10 would represent signal lines on the bus through which the device communicates.

These data lines 8,9 . . . 10 are connected to the bus driving circuitry of FIG. 1 through the I/O pins of the device as is well known in the art.

In the bus driving circuitry shown in FIG. 1, inductor 1 is connected to a node 2 which is fixed to a voltage midway between the pre-defined voltage levels, called the virtual-ground. Inductor 1 may be formed from conductive traces on an integrated circuit as is well known in the art or formed from circuitry that simulates the voltage and current response characteristics of an inductive element. Alternatively and preferably, inductor 1 may be formed of wound wire coupled to the data bus.

In the preferred embodiment, a digital HIGH corresponds to $V_{CC}$ (=5V), and a digital LOW to 0V. Inductor 1 connected to the virtual-ground at node 2 is thus held at $(V_{cc}-0)/2=2.5V$. The virtual-ground is referred to as the reference line, or reference-plane. In conventional systems, the ground is the reference. Line capacitances 5,6 . . . 7 of the data lines 8,9 . . . 10 are essentially between the lines and the virtual-ground. These line capacitances 5,6 . . . 7 schematically illustrate the self-capacitances of data lines 8,9 . . . 10 and are not separate circuit components. The virtual-ground can be buffered between the power supply lines by adding decoupling capacitances 3 and 4. When these decoupling capacitances are more than 10 times the sum of capacitances of all the driven data lines, the reference plane for the data lines can as well be the ground node, which then removes the need for an extra reference plane at Vcc/2. For clarity, it is presumed that the reference plane is tied to the virtual-ground.

The other side of inductor 1 is connected to common node 17 which is further connected to a column of switches SW1, SW2, . . . SWM (11,12 . . . 13) which allow connection of common node 17 with all or a subset of the lines 8,9 . . . 10 of the data bus.

Consider all switches SW1, SW2, . . . SWM (11,12 . . . 13) to be open (high impedance) an consider that some of the data lines are in the HIGH, and the others are in the LOW-state.

If some of the lines in the LOW-state are to be switched to the HIGH state, then the switches on these lines are closed simultaneously. The inductor 1 will see a voltage of $-V_{CC}/2$, referenced to its virtual ground plane and will start injecting current in the common node 17, hence into the connected lines. At that moment an LC circuit is created, with inductor 1 providing the inductance L, and capacitance C being the sum of the capacitances of the connected data lines. If the number of connected lines is N, then the total C is $C=N\times C_{line}$. The lines do not need to have equal capacitance. In the examples however we consider them to be equal as would be the case for a data bus where the data lines have equal length and shape.

If the switches remain closed, and in the ideal case whereby the closed switches have a zero impedance, the circuit will oscillate forever between 0V and $V_{CC}$, that is node 17 will oscillate plus or minus 2.5V ($V_{CC}/2$) referenced to the virtual ground of inductor 1. The goal, however, in the LOW to HIGH transition being described, is to switch only to the HIGH voltage level and to stay there. To accomplish this it is sufficient to open the switches when the circuit has completed half of one complete period, i.e. at the moment the voltage at the common node 17 has reached its maximum.

Figure 2:
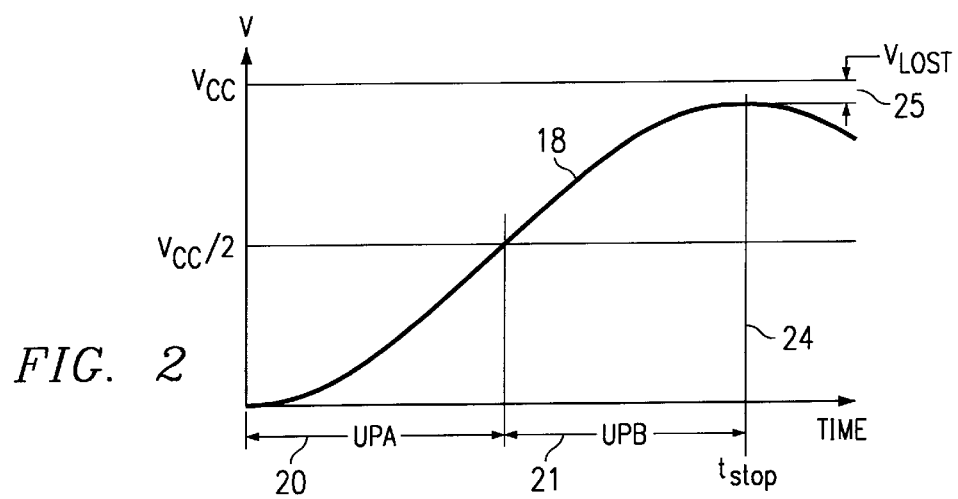
FIG. 2 is a timing diagram showing voltage on common node 17 of FIG. 1 when witching from a LOW to HIGH state.

FIG. 2 illustrates this. Curve 18 shows the voltage of the common node 17 versus time. The voltage increases sinusoidally, with a center voltage essentially at the level of the virtual-ground. At a half period, i.e. at $t_{stop}$ 24, the voltage is at its maximum. At this point the lines are disconnected by opening their closed switches. The temporarily connected lines have now changed voltage level from LOW to HIGH.

In FIG. 2, the curve illustrates a case where the switches have a finite conductance, therefore the voltage reached is somewhat ($V_{lost}$ 25) lower than $V_{CC}$. In the ideal, when the switches and data lines have zero resistance, $V_{CC}$ will be reached exactly and no energy is lost. However, in real world circuit elements, some energy is lost due to resistive elements and additional energy must be introduced into the system, as will be explained in detail below.

The switching of data lines from a LOW voltage level to a HIGH voltage level is accomplished as follows. Energy on the connected data lines is transferred to the self-inductance 1, followed by a redistribution of the energy to the same connected data lines. First, the energy of the data lines, stored by capacitances 5,6 . . . 7 loaded to −Vcc/2 is converted into magnetic energy in inductor 1. This happens during the time UPA 20, indicated on FIG. 2. At the end of UPA 20, the energy resides completely in inductor 1 and no energy resides in the data lines (voltage at virtual-ground). During the period UPB 21, the energy is redistributed among the connected data lines, but with opposite charging direction, or polarity, relative to the virtual ground.

To switch a subset of data lines from HIGH to LOW, a similar action has to be undertaken. These HIGH state lines are connected simultaneously to the inductor 1, and the inverse of the LOW to HIGH transition happens. The common-node voltage 17 goes from HIGH to LOW, as shown on curve 19 of FIG. 3. During the period DOWNA 22, the energy is transferred to inductor 1, and during the period DOWNB 23 the energy flows back to the connected data lines but with opposite charging direction, or polarity, relative to the virtual ground.

To switch a subset of data lines from LOW to HIGH as well as another subset from HIGH to LOW, two techniques can be used. The first technique, sequential switching, is to first switch all the lines going from LOW to HIGH at one time by connecting them to common node 17 and hence inductor 1. After those lines have switched to the HIGH state, they are disconnected from inductor 1 and the lines switching from HIGH to LOW are connected to inductor 1 via common node 17, resulting in the transitions as described above. A detailed example of sequential switching is provided below in the description of FIG. 11.

Figure 4:
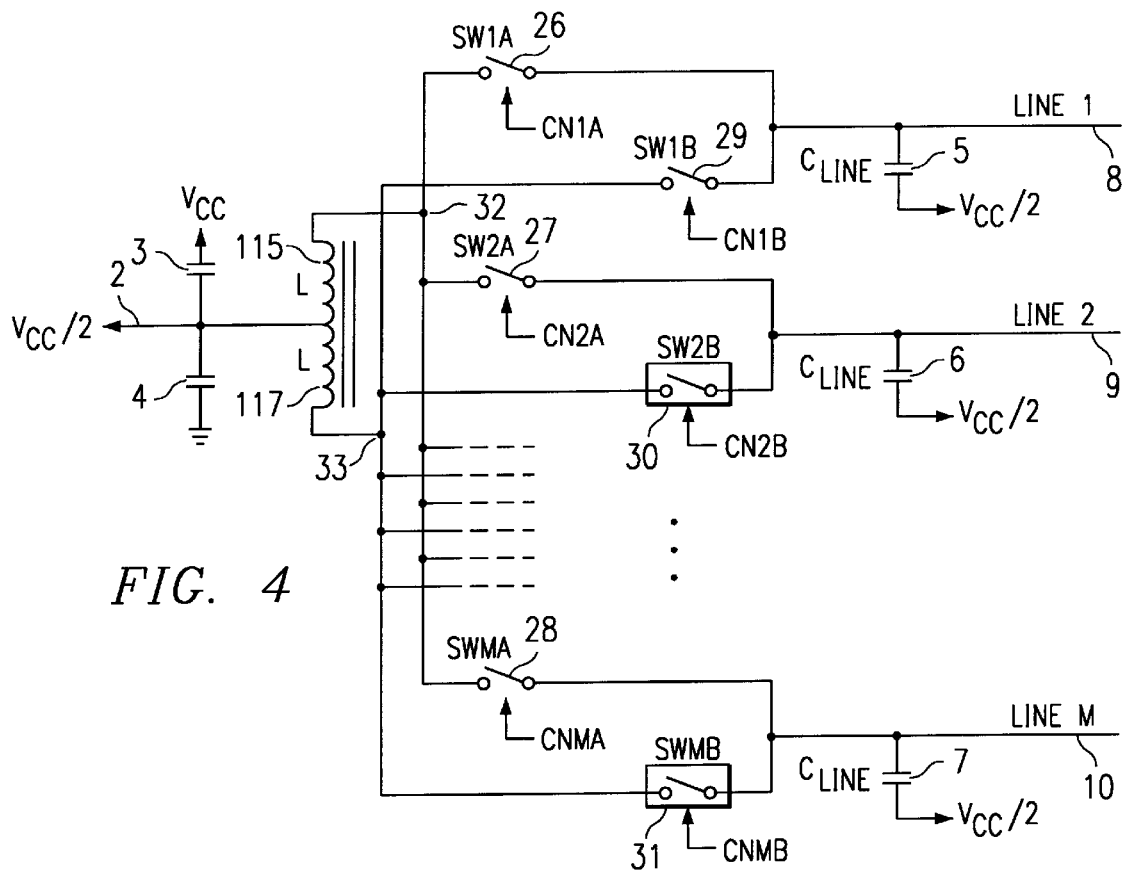
FIG. 4 is a schematic diagram of second preferred voltage switching circuit.

FIG. 4 shows an alternative embodiment which allows a second technique of switching, i.e. concurrent switching or simultaneous switching. By providing two columns of switches, SW1A, SW2A, . . . SWMA (26,27 . . . 28), and SW1B, SW2B, . . . SWMB (29,30 . . . 31), an two inductors 115 and 117, switching a subset of lines from LOW to HIGH can be achieved concurrently with another subset of lines switching from HIGH to LOW. To accomplish this the first column of switches 26,27 . . . 28 together with inductor 115 is always used for upward switching (i.e. LOW to HIGH), and the second column of switches 29, 30 . . . 31 together with inductor 117 is always used for downward switching (i.e. HIGH TO LOW). The switching of each subset is accomplished as described above.

Figure 5:
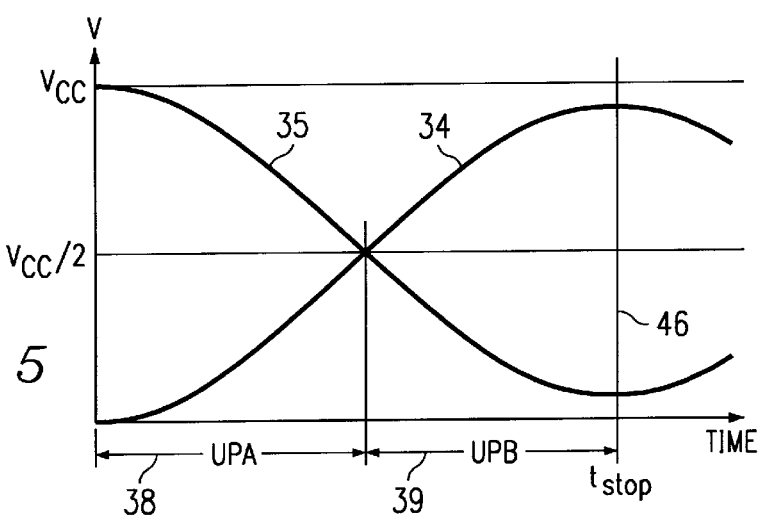
FIG. 5 is a timing diagram showing the voltage on common nodes 32 and 33 of FIG. 4 when inductor 115 and 117 are mutually coupled.

FIG. 5 shows the voltages at the first common node 32 and the second common node 33 of FIG. 4. Curves 34 and 35 are the voltages for the case of strongly mutually coupled inductors 115 and 117, as schematically indicated in FIG. 4 by the double line connecting inductors 115 and 117. For clarity, elements that are common to the various Figures are given common reference numbers. Even if the number of lines switching upwards is different from the number of lines switching downwards, the moment when the maximum voltage is reached by the lines going upwards essentially equals the moment the minimum voltage is reached by the lines going downwards, i.e. at moment $t_{stop}$ 46.

Figure 6:
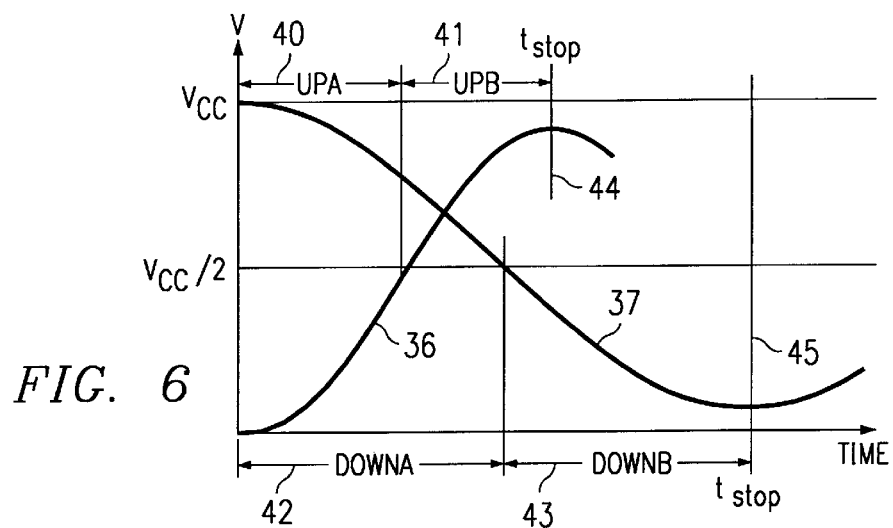
FIG. 6 is a timing diagram showing the voltage on common nodes 32 and 33 of FIG. 4 when inductors 115 and 117 are not mutually coupled.

If inductors 115 and 117 are not or only weakly coupled, the voltages on nodes 32 and 33 will exhibit a different switching speed, shown by curves 36 and 37 in FIG. 6. In the particular case illustrated, there are more lines switching from HIGH to LOW than from LOW to HIGH and hence $t_{stop}$ 44 is reached earlier than $t_{stop}$ 45.

In general, the concurrent operation technique is faster by allowing all lines to be switched simultaneously. The sequential technique is less complicated and consumes less chip area because fewer switches and inductors are required.

The remainder of this explanation will refer to the sequential principle of operation. The person skilled in the art can readily adapt this part of the explanation to the concurrent structure.

The circuit of FIG. 1 assumed ideal lossless elements. Losses due to non-ideal components must be compensated for, however. Consider curve 18 of FIG. 2 again: the maximum voltage at the peak of the curve is not exactly the voltage $V_{CC}$. There is a little loss in energy, reflected by $V_{lost}$ 25. $V_{lost}$ 25 and $t_{stop}$ 24 can be found by calculations and approximates:

$$V_{lost} \approx V_{cc} \frac{\pi}{4} \frac{R_s}{N} \sqrt{\frac{NC_{line}}{L}} \approx V_{cc} \frac{\pi}{4} R_s \sqrt{\frac{C_{line}}{NL}} \quad (1)$$

$$t_{stop} \approx \pi \sqrt{N L C_{line}} \quad (2)$$

where $R_S$ includes all series-resistances encountered per line: the resistance of the closed switch, the line resistance itself (for lossy lines) and the like. $C_{line}$ is the capacitance of one line and all connected capacitances to the line (e.g. an input capacitance for ESD-protection); L is the value of inductor 1; and N is the number of switching lines. As shown in Formula (2), $t_{stop}$ is a function of the number of switching lines.

If $V_{lost}$ 25 is only 10% of the $V_{CC}$ voltage, no errors at the receiver side will be induced. The receiver will see the result as a HIGH-voltage level. However, starting from this lower HIGH-voltage ($V_{CC}-V_{lost}$) level the next time; an extra $V_{lost}$ will be accumulated when switching again. The capacitive energy on the lines will lower after more switching cycles. Two systems compensate for this: a pump and a snap circuit. A pump introduces energy into the system to compensate for losses. A snap circuit retains the lines at their most recent voltage level, with a low impedance.

Figure 7:
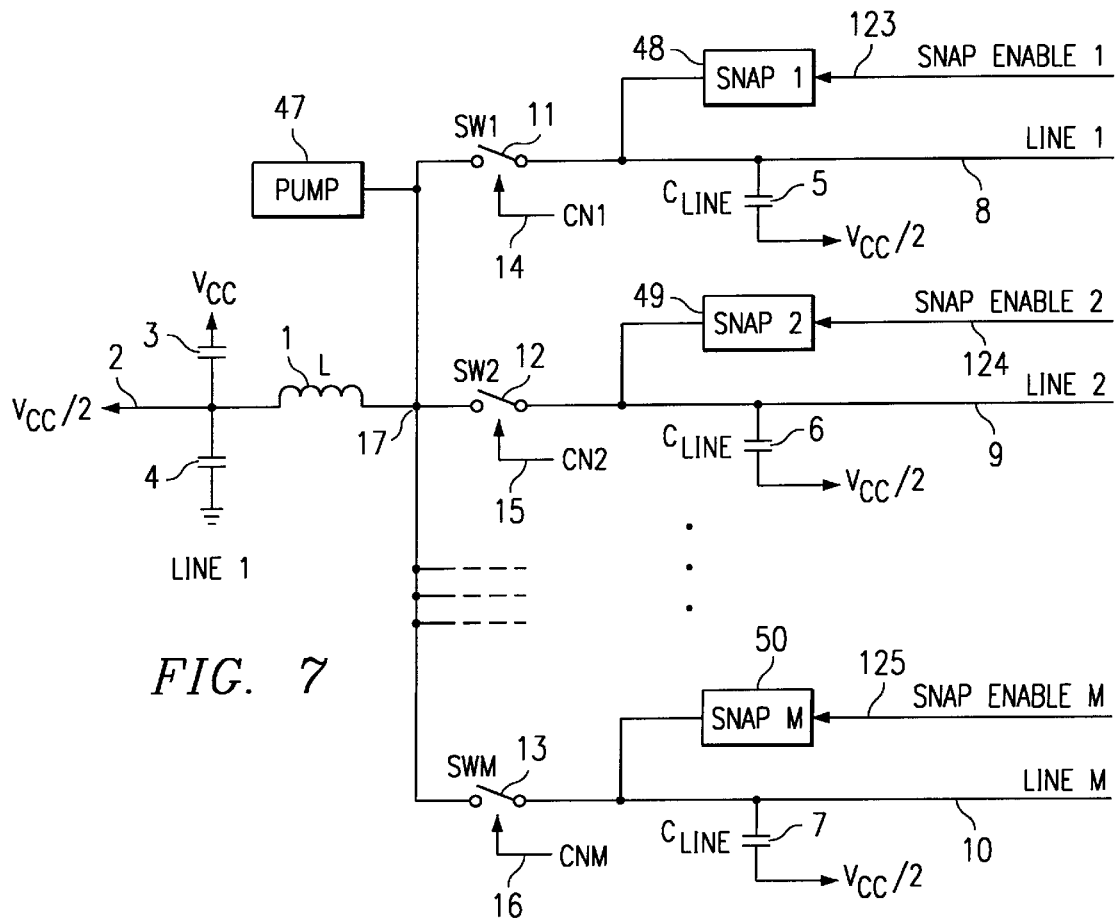
FIG. 7 is a schematic diagram of the first preferred voltage switching circuit with the addition of a pump and snap circuits.

FIG. 7 illustrates the preferred switching circuit of FIG. 1 but with the addition of snap circuits 48,49 . . . 50, and a common pump 47. The pump is connected to common node 17, and is operational for any number of switching lines. The snap circuits will be explained first, the explanation concerning the pump follows.

Figure 8:
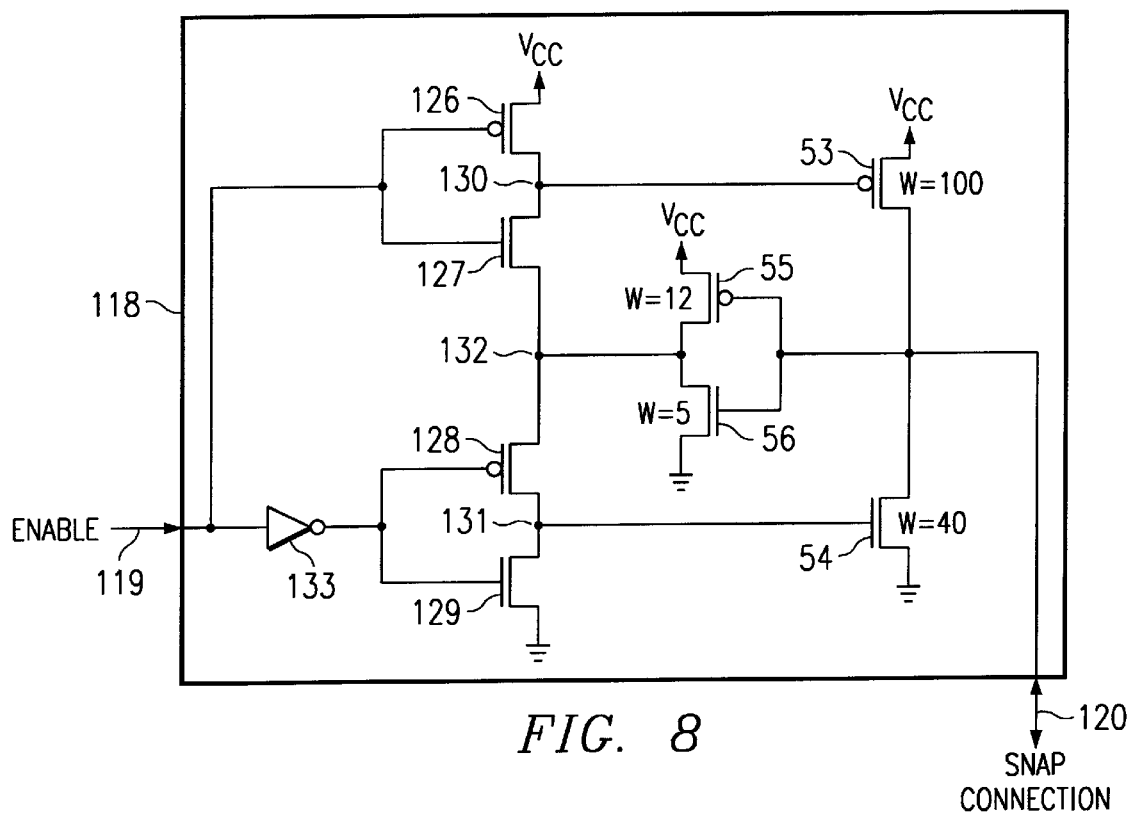
FIG. 8 schematically illustrates a snap circuit.
Figure 9:
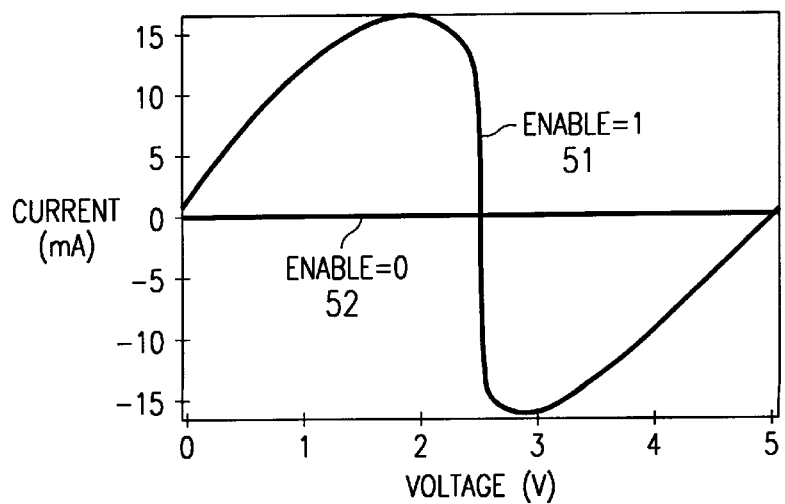
FIG. 9 illustrates the current-voltage characteristics of the snap circuit of FIG. 8.

Snap-circuit 118 is illustrated in FIG. 8. In between voltage level transitions, the switches 11, 12 . . . 13 of the lines 8,9 . . . 10 of FIG. 7 are left open. The line capacitance is charged and the voltage should remain at its logic level. To maintain this state it is preferable to lock the lines at their voltage level. There are other factors which can make the line drift, e.g. leaks, electromagnetic pick-up, cross-talk and similar factors. To be compatible with other drivers on the line (which might use conventional line driving with the principle of push-pull buffers, and output enable control lines), one must be able to disconnect and leave the lines floating (Hi-Z) on demand. The snap circuit 118 FIG. 8 is well suited for this. It has a digital input "enable" 119, and a "snap connection point" 120, for connecting the line. Snap-connection 120 has current-voltage characteristics that depend on the enable state 119. If the enable 119 is HIGH, snap connection 120 has current-voltage characteristics as shown by curve 51 of FIG. 9, if enable 119 is LOW curve 52 is obtained. Curve 52 indicates a flat, zero current curve, reflecting the desired high impedance nature of the circuit when enable 119 is low.

When enable signal 119 is LOW, inverter 126, 127, outputs a logic HIGH. This HIGH level is inverted at the input of transistor 53 forcing transistor 53 OFF. The LOW enable signal 119 is inverted to a HIGH by inverter 133. Inverter 128, 129 receives the logical level HIGH and outputs a logic state LOW to transistor 54. Hence, both transistors 53 and 54 are in the OFF state, keeping the snap connection 120 in a high impedance state.

When enable signal 119 is in the HIGH logic state, transistors 127 and 128 are ON and transistors 126 and 129 are OFF, allowing common node 132 to float to the voltage level determined by the voltage on snap connection 120. If a line with a voltage between 0 and 2.5V is connected to snap connection 120 (with enable 119 HIGH), inverter 55, 56 delivers a logic HIGH to common node 132, hence driving transistor 54 in the ON state forcing the snap connection to 0V. If a line with a voltage between 2.5V and 5V is connected to the snap connection 120 (again with enable 119 HIGH), common node 132 receives a LOW level signal, hence driving transistor 53 in the ON state, forcing the snap connection to Vcc=5V. Transistors 53 and 54 are designed to deliver equal drive power and transistors 55 and 56 are designed to position the negative differential resistance part of curve 51 at virtual ground. Curve 51 has a positive differential resistance of about 60 Ω around its origin, and also around 5V. To snap with more force (a lower impedance than 60 Ω), it is sufficient to widen the gates of transistors 53 and 54.

If there is time between voltage level-transitions, snap circuit 118 will cancel $V_{lost}$ within a few RC-cycles, with R=60 Ω, and C the line capacitance Cline. At power-up, the snap-circuit initializes the lines to logic levels. If the data line has a transmission-line character (which will be the case for long lines or for fast switching) the snap circuit will dampen the oscillations. During the voltage level-transitions, this snap-circuit has to be disconnected. It would conflict with the energy recycling principle of this invention, and would not result in low power operation.

Figure 10:
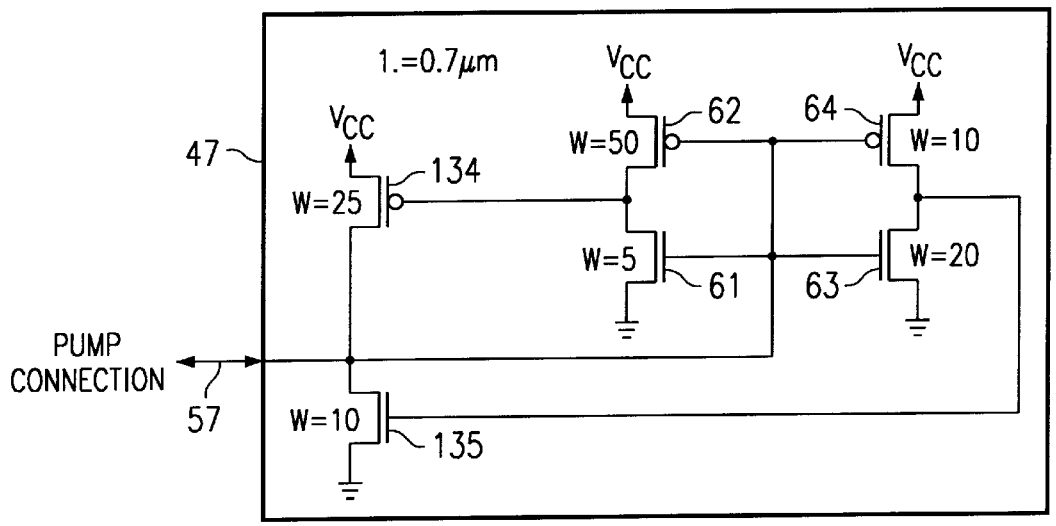
FIG. 10 schematically illustrates a pump circuit.
Figure 11:
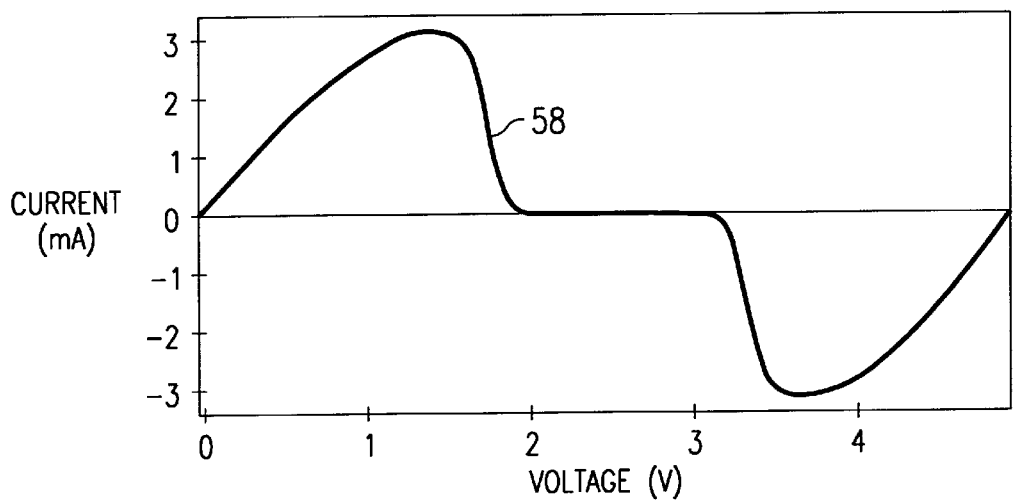
FIG. 11 illustrates the current-voltage characteristics of the pump circuit of FIG. 10.
Figure 25:
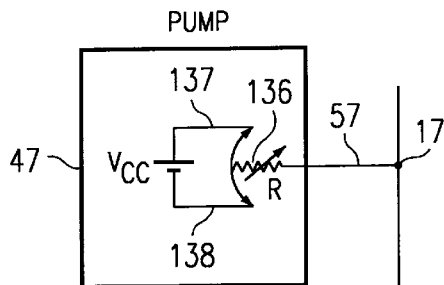
FIG. 25 is a simplified schematic representation of the pump circuit of FIG. 10.
Figure 25:
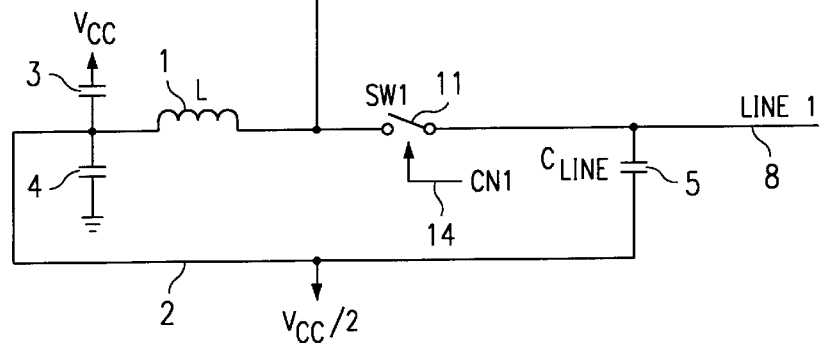

In the case of continuously switching lines, snap circuit 118 will not have sufficient time to compensate for the $V_{lost}$ 25. As noted above, the drop in voltage level arising from $V_{lost}$ is cumulative. To remedy this a pump 47 (FIG. 7) is connected at common node 17 by its pump connection node 57 as shown in FIG. 10. The pump is used for the upward switching lines as well as the downward switching lines. Curve 58 of FIG. 11 illustrates the current-voltage characteristics of pump 47. A simplified equivalent circuit is illustrated in FIG. 25.

During the upward or downward switching process, care has to be taken not to waste any energy due to the inductive reaction of inductor 1. Taking a downward transition of line 8 as an example, if line 8 is abruptly connected to the LOW voltage level (shown as 138 in FIG. 25), energy from the line capacitance 5 would be dissipated due to the leakage of carriers into the pump circuit. Hence this energy would not be stored as magnetic energy in inductor 1. As noted above, the magnetic energy stored by inductor 1 has to be used in a later phase of the switching process to charge the line capacitance in the opposite direction. Therefore, the line capacitance is kept in the HIGH state a little longer through the connection via a voltage-dependent resistance (illustrated schematically as resistance 136 in FIG. 25) connected to the logic HIGH state of Vcc (137 in FIG. 25). This results in an extra injection of current into inductor 1 and consequently will compensate for $V_{lost}/2$ in a later phase of the switching process For line voltages between 3V and 2V, the pump circuit is quasi-disconnected (high impedance) and the bus line freely oscillates with the inductor. Once the voltage of the dropping line 8 is below approximately 2V, the line is forced to the LOW state (138 in FIG. 25) again via the voltage-dependent resistance 136 which now boosts the transfer of magnetic energy back into the capacitance, restoring the second half of $V_{lost}$. Analogous reasoning applies to an upward switching process, where the line is initially connected to the LOW voltage state 138 of the pump circuit 47 to load inductor 1 with extra magnetic energy by extracting carriers toward the pump circuit 47. Subsequently, the line is boosted to 5V by the pump circuit providing current.

Therefore, pump 47 slows the charging process during the first half period of a switching process by attracting the line voltage to its original state and accumulating magnetic energy in order to accelerate the charging process during the second half by forcing the line to the other logic state.

Curve 58 of FIG. 11 shows the current-voltage characteristics of pump 47. For voltages between 0 and 1.8V inverter 61, 62 (FIG. 10) outputs a logic signal HIGH, which is inverted and fed to pass transistor 134, turning transistor 134 OFF. Inverter 63, 64 sends a logical HIGH to pass transistor 135 turning it ON and hence extracting current from common node 17 and attracting common node 17 towards 0V.

For voltages on common node 17 between 3.2V and 5V transistors 63 and 64 hold pass transistor 135 OFF. Inverter 61, 62 outputs a LOW which is inverted and fed to pass transistor 134, resulting in pass transistor 134 being turned ON and hence injecting current into common node 17 and attracting common node 17 towards Vcc=5V. Between 1.8V (the exact level depending on transistors 63 and 64) and 3.2V (the exact level depending on transistors 61 and 62), both pass transistors 134 and 135 are held OFF and hence no current is injected or extracted.

As is known in the art, the input voltage at which the output of an inverter switches is dependent upon the aspect ratio of the transistors. A higher aspect ratio (the ratio of width to height, or W/L) for an NMOS transistor results in a lower switching voltage level and a lower aspect ratio results in a higher switching voltage. Conversely, a lower W/L ratio for a PMOS transistor results in a lower switching voltage. To obtain a switching level near Vcc/2 for inverters 61, 62 and inverter 63, 64 the W/L ratio of the PMOS transistors are designed to be 2 to 4 times larger than for the NMOS transistors, compensating for the smaller drive characteristics of PMOS transistors. In this way, both inverters 61, 62 and 63, 64 are OFF around 2.5V. Pump 47 helps common node 17 in both directions, switching upwards and switching downwards, and the help is given during voltage transitions . The most efficient help is given at the extreme voltages (close to 0V and close to 5V). No help is given around virtual-ground (Vcc/2), since this help turns out not to be effective.

Figure 12:
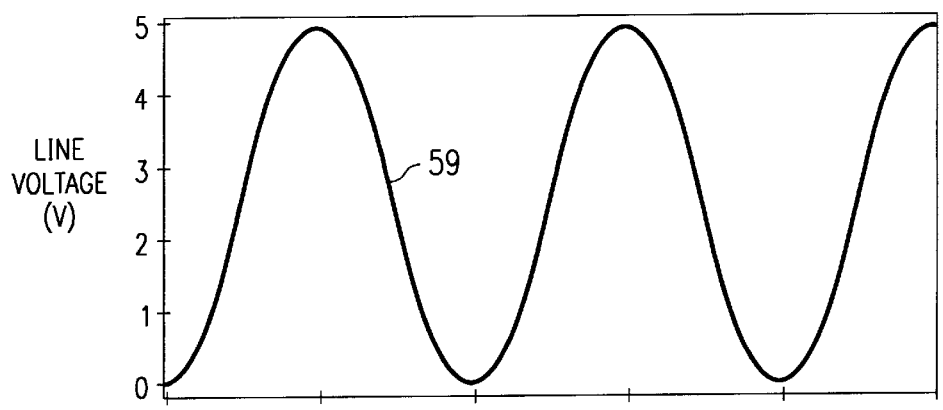
FIG. 12 illustrates the voltage waveform of a continuously switching data line.
Figure 13:
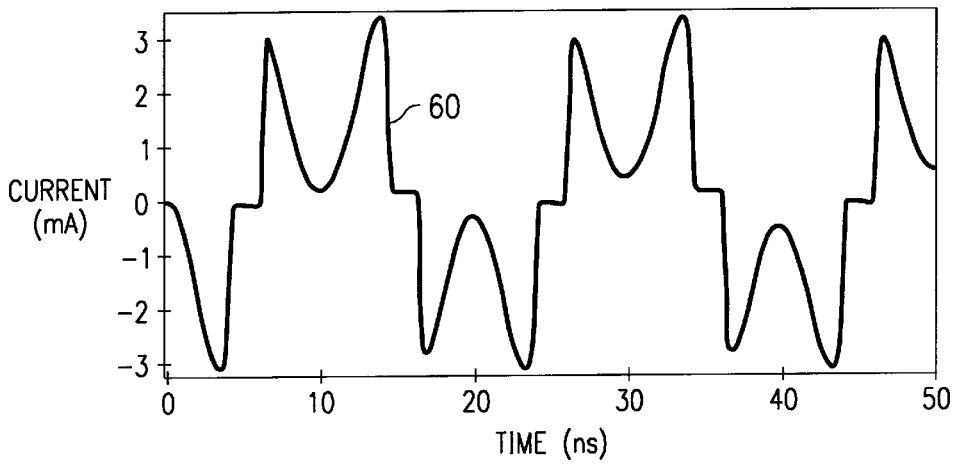
FIG. 13 illustrates the current delivered by the pump circuit of FIG. 10 in the case a continuously switching data line.

FIG. 12 illustrates the voltage characteristics of a continuously transitioning common node 17 when L=100 nH, $C_{line}$=10 pF, and $R_S$=10 Ω, and with ten data lines permanently connected (i.e. the switches, e.g. switches 11, 12 . . . 13 of FIG. 7, are left in the closed state). FIG. 13 shows the current delivered by pump 47 versus time in the given example with 10 lines. $V_{lost}$ will not be accumulated but is compensated for by pump 47. In the limit, $V_{lost}$ remains constant.

Figure 14:
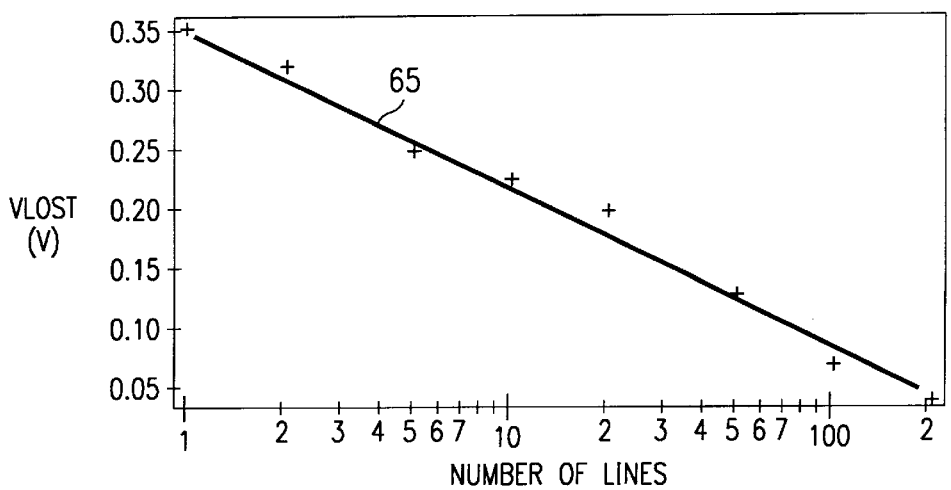
FIG. 14 graphically illustrates the effect of the number of connected data lines on the output voltage of the pump circuit of FIG. 10.

The effect of the number of lines on the ability of pump 47 to compensate for $V_{lost}$ is illustrated in FIG. 14. The same pump works well even for a large number of switching lines. This is explained by the fact that the transition time between voltage levels increases as the number of lines switching increases, thus the pump's operation time is extended. Also, as indicated in Formula (1), $V_{lost}$ becomes smaller with increasing N because the data lines are in parallel, resulting in an overall increased conductance (and hence reduced resistance) as more lines are added.

From Formula (2) it is clear that $t_{stop}$ 24, being the moment when the voltage at common node 17 is reaching its maximum or minimum, is a function of the number of switching lines. It is important to have a good estimate of this end of conversion moment, since this is the moment the switches have to be opened again. The better the estimate for this moment, the more power is saved. Various methods can be employed to detect or estimate the end of conversion moment. One could use voltage detection circuitry to detect a maximum or minimum (depending on which way the lines are switching) voltage on the switching data lines. Once a maximum or minimum is detected, the switches are opened. An inherent latency in the detection circuitry will, however, result in the switches being opened at some finite time after the maximum or minimum voltage has been detected, resulting in lowered efficiency. Alternatively, one can detect the number of data lines that are switching simultaneously and, based upon Formula (2), determine the proper moment, $t_{stop}$ at which to open the switches. This method will be affected by variations in the line capacitances, however. One can also try to stop when 90% of the voltage swing is reached, but, this technique will not produce satisfactory results if common node 17 only reaches, say, 85% of Vcc due to high losses or some other factors. Another way to determine $t_{stop}$ is to measure the current through inductor 1 and disconnect the data lines from inductor 1 when the current is near zero.

A more robust way and the preferred method is the pulse-doubler circuit 66 illustrated in FIG. 15. The time when the transition starts, i.e. the time when the switches, e.g. 11, are closed, is known, and the time at which the voltage conversion is at the mid-point can be easily determined by a simple inverter measuring when the voltage over the inductance equals zero. By doubling the time from the start of transition to the mid-point, $t_{stop}$ is obtained at which point switch 11 is opened. The person skilled in the art can easily understand pulse-doubler circuit 66, and will readily recognize several alternative circuits can be used as a matter of design choice. Briefly, however, input pulse UPA 67 going HIGH turns on transistor 302, allowing capacitor 304 to slowly discharge from Vcc/2 to 0V. The value of capacitor 304 is chosen such that it will not discharge to 0V sooner than the expected maximum duration of pulse 67. The operation of inverters 306, 308, and 310 cause output signal PD1 to go HIGH. When input pulse UPA 67 goes LOW, capacitor 304 begins charging up to Vcc/2 via transistors 312 and 314. When the voltage on capacitor 304 reaches Vcc/2, transistor 314 is turned OFF via the signals generated by inverters 306 and 308 and output signal PD1 goes LOW via the signals generated by inverters 306, 308, and 310.

Pulse-doubling circuit 66 generates an output pulse PD1 68 (FIG. 17) essentially twice as long as incoming pulse UPA 67 (FIG. 16). At the end of the output pulse 68, all switches SW1, SW2, . . . SWM (11,12 . . . 13) have to be opened. Input signal UPA 67 is generated by control generation block 81 of FIG. 21, as illustrated by the state machine diagram of FIG. 22.

Figure 19:
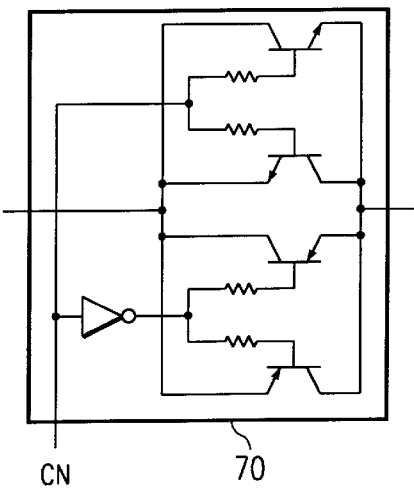
FIG. 19 is a schematic diagram of a second preferred integrated circuit switch.

Formula (1) shows the importance of using switches with a low on-resistance in order to minimize $V_{lost}$. FIGS. 18, 19, and 20 demonstrate three alternative preferred integrated switches. Switch 69 is a classical CMOS switch. PMOS transistor 71 and NMOS transistor 72 must be chosen wide enough to obtain a low on-resistance, emphasizing good power recycling. In some cases a simple pass transistor is sufficient. BiCMOS switch 70 is better, since it can exhibit a lower on-resistance. A way to avoid the estimation of the end-of-conversion moment, $t_{stop}$, is to integrate diodes 121, 122 in series with switches 73, 74 as shown in FIG. 20. The current stops flowing, and will not revert, due to the diode action. Two switches 73 and 74 are required, one for switching upwards 74, and one for switching downwards 73 with diodes 121 and 122 in opposite directions. Diodes 121, 122 create an extra voltage drop which unfortunately limits the power recycling efficiency.

Figure 21:
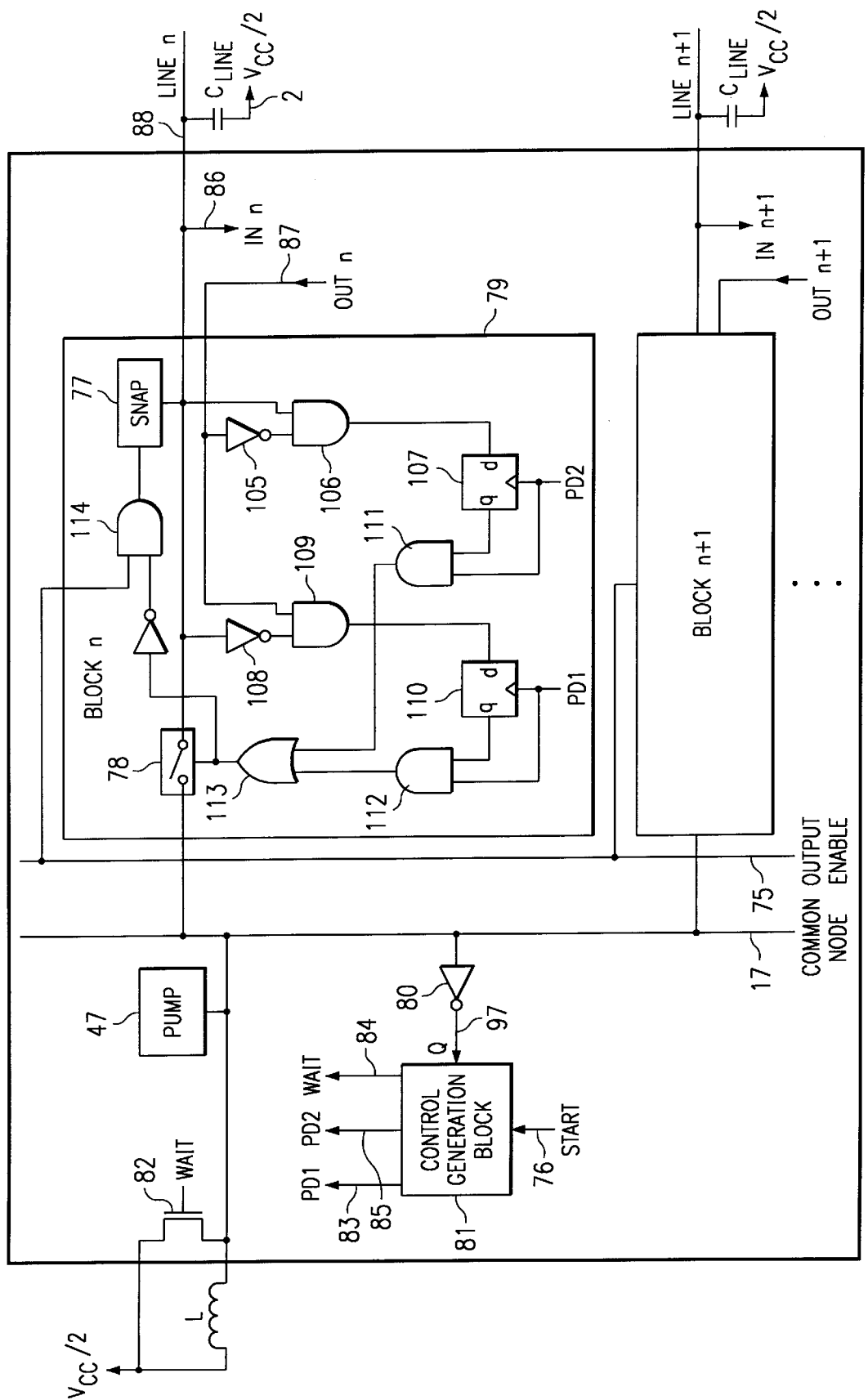
FIG. 21 schematically illustrates a first preferred low power data communication system.

FIG. 21 illustrates a preferred system embodiment of the present invention for driving a data bus with energy recycling and low power dissipation. This example is of the sequential type: first a transition from LOW to HIGH is accomplished, followed by a HIGH to LOW transition. For clarity, only one block 79 associated with one line 88 is illustrated in detail. The elements shown and explanation concerning block 79 and line 88 apply equally to similar blocks associated with each of the lines n, n+1, etc. to be transitioned between logical voltage levels.

In operation, the circuitry of FIG. 21 would be incorporated into the bus driving circuitry of the bus driver device. As an example, FIG. 21 could illustrate a portion of the bus driving circuitry of a microprocessor and lines n and n+1 could represent the data lines of the processor's local bus. Alternatively, the circuitry of FIG. 21 could represent the bus driving circuitry of a graphics controller communicating over a VL or similar bus, represented by lines n and n+1. In response to data desired to be communicated across the bus by internal circuitry (not shown) the bus driving circuitry of FIG. 21 drives the appropriate voltage level (signal) onto the bus lines. The desired logic voltage level is received on the OUT line 87 from the internal chip logic circuitry.

Taking line 88 as an example, assume a HIGH voltage level is wanted, and line 88 is currently in the LOW state. AND gate 109 ANDs together the HIGH signal from OUT 87 and the inverted signal from line 88 (a LOW inverted to HIGH) and places a HIGH on the input of D-Latch 110. D-Latch 110 outputs a HIGH to AND gate 112, which ANDs together the output from D-Latch 110 with the PD1 signal 83 generated from Control Generation Block 81 and outputs a HIGH to OR gate 113 which signals switch 78 to close allowing line 88 to transition from the LOW to HIGH state, as described above.

On the other hand, if a HIGH level is desired, and line 88 is already in the HIGH state, Inverter 108 will output a LOW to AND gate 109, resulting in a LOW to the input of D-Latch 110. In this case, D-Latch 110 will output a LOW to AND gate 112 which will output a LOW to OR gate 113. Because PD2 85 (from Control Generation Block 81) is low during the LOW to HIGH transitions, OR gate 113 will output a low to switch 78 and it will remain open. Thus the voltage level of line 88 will be unaffected during the transition of other lines connected to common node 17.

Assuming the desired voltage level is LOW and line 88 is in the HIGH voltage state, inverter 105 will invert the LOW level on OUT line 87 to a HIGH, which is ANDed together with the HIGH level on line 88 by AND gate 106 to produce a HIGH on the input of D-Latch 107. When signal PD2 85 is driven HIGH by Control Generation Block 81 (during the HIGH to LOW transitions), D-Latch 107 will output a HIGH to AND gate 111, which outputs a HIGH to OR gate 113, which causes switch 78 to close allowing line 88 to transition to the LOW state in the manner described above.

If, on the other hand, line 88 is already in the desired LOW state, GATE 106 will output a LOW to D-Latch 107, resulting in a LOW input to AND gate 111 and hence OR gate 113 and switch 78 will remain open (again because signal PD1 83 remains low during the HIGH to LOW transitions).

As discussed above, snap circuit 77 is always enabled, except when its associated line 88 is in a voltage level transition or when the bus master demands a high impedance output stat (output enable=LOW). Output Enable signal 75 derives from a bus master or other bus logic circuitry that may from time to time require the data lines to enter a high impedance state. AND gate 114 ANDs together Output Enable signal 75 with the inverted output from OR gate 113. This means that snap circuit 77 will remain enabled unless Output Enable signal 75 goes low, or the output of OR gate 113 goes high, which indicates the switch 78 is closed to allow a voltage level transition. The operation of snap circuit 114 is described in detail above in connection with FIGS. 8 and 9.

Common node 17 connects all switches, including switch 78, with inductor 1, pump-circuit 47, INV-gate 80 and transistor 82. Pump 47 operates globally, independently on the number of switching lines, as previously described. INV-gate 80 senses the moment the voltage on the common node passes Vcc/2. At this moment the polarity of common node 17 reverses relative to the virtual ground or reference plane. The resulting signal Q 97 from INV-gate 80 feeds Control Generation Block 81, which generates the signals PD1 83, PD2 85 and WAIT 84. The latter signal drives transistor 82. The first two signals are used to control switch 78 as described above.

Transistor 82 prevents common node 17 from oscillating wildly when no voltage levels are changed, i.e. when WAIT 84 is HIGH indicating that all switches are open. If at the end of conversion of a preceding voltage level transition the switches have been opened a little late or little early some energy will be in inductor 1 and high frequency oscillations and voltages outside the desired 0 to $V_{CC}$ range could occur. To avoid this, transistor 82 is designed to dissipate the remaining energy of inductor 1 by clamping its other terminal to Vcc/2.

Figure 23:
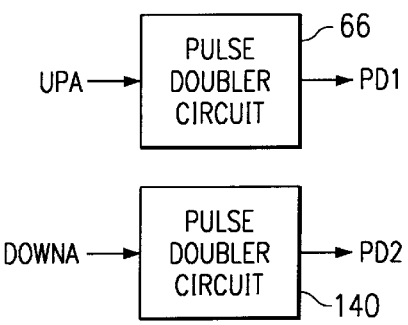
FIG. 23 is a block diagram of pulse doubler circuits.
Figure 22:
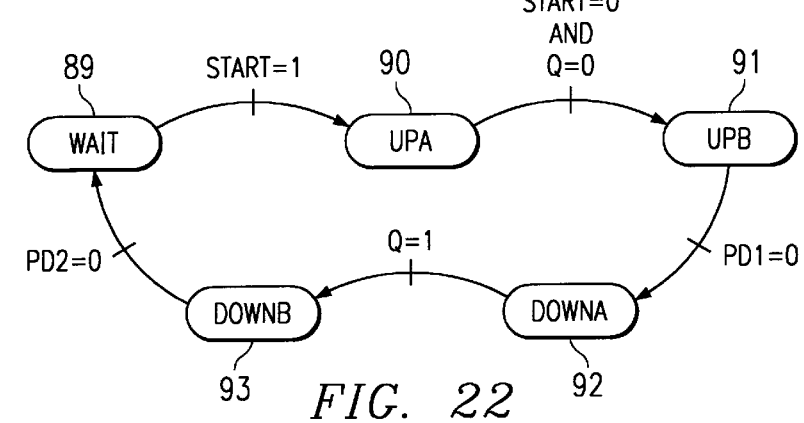
FIG. 22 is a state diagram for the low power data communication system of FIG. 21.

A state diagram for Control Generation Block 81 is given in FIG. 22. The first state is WAIT 89. When a start of conversion (voltage transition) is desired, as indicated by a pulse on Start signal line 76, the system transitions to state UPA 90 in which signal UPA 67 is HIGH A start of conversion signal is generated by the internal circuitry of the microprocessor 202 or RAM 204, or whatever integrated circuit is employing the present invention. For clarity, this internal circuitry is not shown, but it will be apparent to one skilled in the art how to generate a signal indicating that valid data is ready to be driven onto the data bus. When it is sensed by INV-gate 80 that the LOW to HIGH transition is halfway, Q signal 97 goes LOW, signal UPA 90 goes low, and the next state UPB 91 follows. When pulse doubler circuit 66 of FIG. 23 (with input UPA 90) ends its pulse, which is referred to as PD1 signal 83, the state UPB ends, and the LOW to HIGH transition is complete. Next the HIGH to LOW transition (for other data lines transitioning from HIGH to LOW) starts, by entering state DOWNA 92. When it is sensed by INV-gate 80 that the HIGH to LOW transition is halfway, Q signal 97 goes HIGH, and the next state DOWNB 93 follows. When pulse doubler circuit 140 (with input DOWNA) ends its pulse, which is referred to as PD2 signal 85, state DOWNB ends and WAIT state 89 is reentered. Pulse doubler circuits 66 and 140 are internal to Control Generation Block 81 of FIG. 21 and are preferably constructed in accordance with the description of FIGS. 15, 16, and 17.

Figure 24:
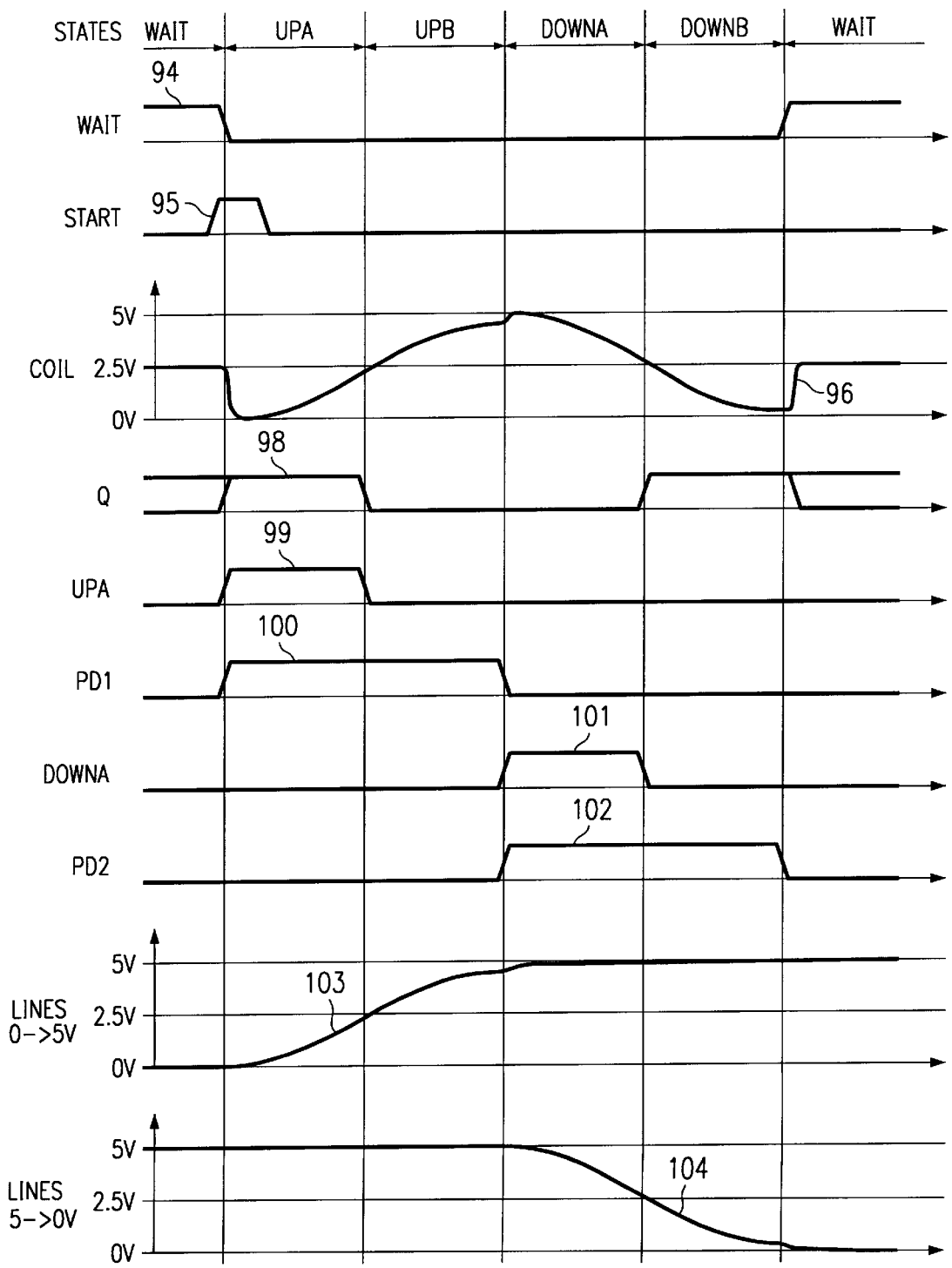
FIG. 24 is a timing diagram of relevant signals for the low power communication system of FIG. 21.

FIG. 24 illustrates the timing for one transition cycle (some lines switching upwards, followed by some lines switching downwards) on a data bus with a data bus driver as in FIGS. 21 and 22. The signal voltages versus time, starting from, and ending in the WAIT state are given. Curve 94 is the WAIT signal, which drives transistor 82. Note that in the quiescent state, WAIT is HIGH, thus allowing transistor 82 to clamp common node 17 to Vcc/2 in order to prevent oscillations. Curve 95 is the Start signal, triggering a conversion. Upon receiving a Start signal pulse from internal logic circuitry generated on chip, as discussed above with reference to FIG. 26, Control Generation Block 81 pulls WAIT LOW. Curve 96 gives the voltage on common node 17. Note that common node 17 is pulled to 0V after transistor 82 is turned off.

Curve 98 is the Q signal 97 driven by INV-gate 80 which switches at the half-way up or the half-way down moment. Curve 100 gives the PD1 signal 83 which is the result of pulse-doubling of curve UPA 99 by the pulse doubler circuit 66. Curve 102 gives the PD2 signal 85 which is the result of feeding curve DOWNA 101 to the pulse doubler circuit 140. Curve 103 gives the voltage on the lines switching from LOW to HIGH, and curve 104 gives the voltage on the lines switching from HIGH to LOW. The lines remaining LOW and the lines remaining HIGH are not shown.

The energy dissipation of an electronic device such as a personal computer using standard ISA and local buses driven with the preferred embodiment bus driving circuits can easily be ten times lower than communication on buses driven by standard methods such as the now commonly used push/pull methods of driving a bus with data lines. Speed and noise margins are not sacrificed for this. The decrease in energy dissipation depends strongly on the resistances of the switching means (in the closed state) that are used. With sufficiently low on-resistance switches, a decrease in bus power dissipation of at least one hundred fold and probably substantially more can be obtained.

FIG. 26 a illustrates a second preferred circuit for switching a data line 302. As discussed above, data line 302 could alternatively be another type of line such as a control line or an address line. While the term "data line" is used throughout this discussion, it should be understood that the invention applies equally to other signal lines as well. In this embodiment, digital HIGH corresponds to $V_{CC}$, and a digital LOW to 0V. Capacitance 301 (CLINE) illustrates schematically the parasitic capacitance (self-capacitance) of data line 302 and is not necessarily a separate circuit component.

Figure 26A:
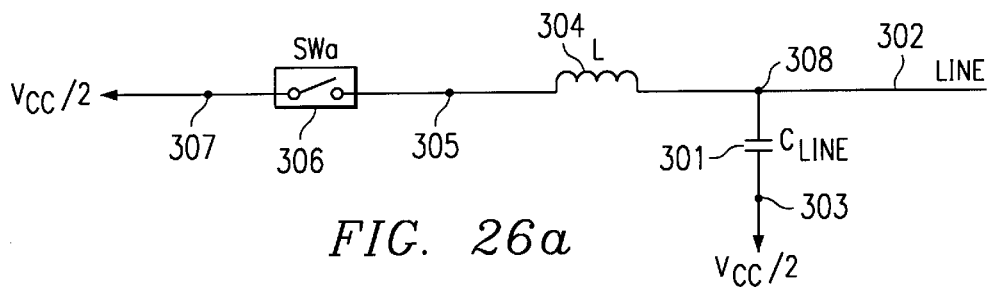
FIG. 26a is a schematic diagram of a preferred voltage switching circuit.

As illustrated in FIG. 26a, line capacitance 301 is essentially between line 302 and virtual-ground 303. In this example the virtual-ground 303 is fixed to a voltage midway between the pre-defined voltage levels. Other voltage levels between $V_{CC}$ and ground could also be utilized. Virtual-ground 303 is referred to as the reference line, or reference-plane. In conventional systems, the ground is the reference. The principle of the present invention can also be applied when the reference is the real ground or $V_{CC}$ or another power supply line. In this discussion, it is presumed that the reference plane is tied to the virtual-ground. The operation of the device will not substantially change when the reference plane is not virtual ground since capacitors have infinite impedance for DC.

Inductor 304 is coupled to the data line 302 at node 308 and to switch 306 (labeled SWa) at node 305. The other side of switch 306 is connected to virtual ground at node 307. Inductor 304 may be formed from conductive traces on an integrated circuit as is well known in the art. Alternatively, or in addition, inductor 304 may be formed from circuitry that simulates the voltage and current response characteristics of an inductive element. Preferably, inductor 304 is formed of wound wire connected to the data line 302. For example, Surface Mounted Device inductors can easily be bought in every specialized shop. In some cases, the inductance inherent in the system may be sufficient and therefore no additional inductance would be necessary.

Figure 26B:
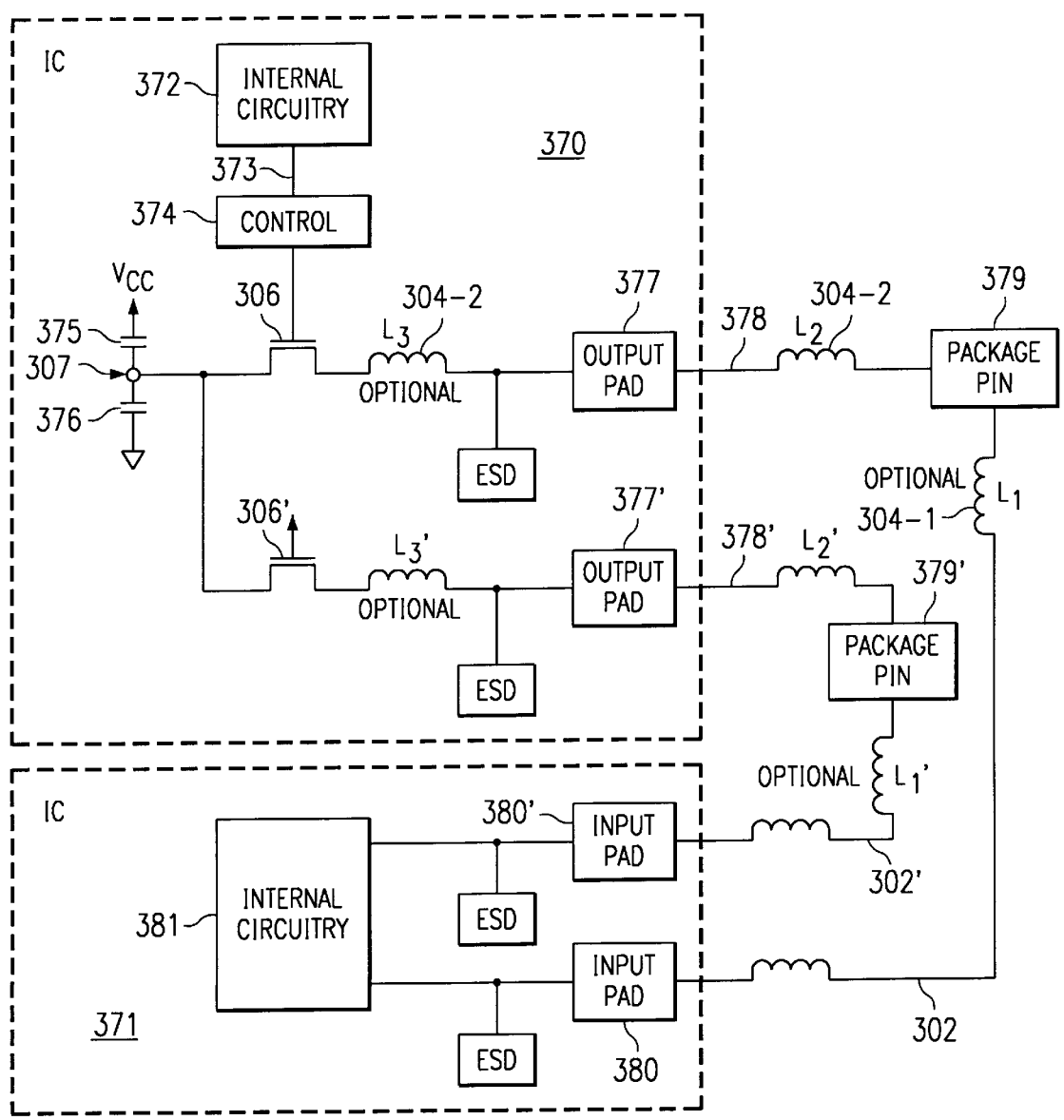
FIG. 26b is a schematic diagram of a specific example of a switching circuit.

FIG. 26b shows a more specific embodiment of the circuit of FIG. 26a. In particular FIG. 26b illustrates two integrated circuits 370 and 371 coupled together by data lines 302 and 302'. As an example, integrated circuit (IC) 370 can be a microprocessor and IC 371 can be a chip (e.g., memory, controller) on a computer system motherboard. IC 370 includes internal circuitry which generates a signal on output line 373. The signal is provided to a control circuit 374 which controls switch 306, which is an NMOS transistor in this example. As described below, control circuit 374 may be a pulse generator.

As discussed in the previous embodiment, the virtual ground can be buffered between the power supply lines by adding decoupling capacitances 375 and 376. When these decoupling capacitors are more than ten times the sum of capacitances of all the driven data lines, the reference plane can be the ground plane thereby eliminating the need for an extra reference plane at Vcc/2. For clarity, it is once again assumed that the reference plane is tied to virtual ground.

Transistor 306 is coupled to signal line 302 through output pad 377, bond wire 378 and package pin 379. As discussed above with respect to FIG. 26a, transistor 306 is also coupled to signal line 302 through an inductor 304. In this example, inductor 304 is distributed over three inductors $L_1$, $L_2$ and $L_3$. First the inductor $L_2$ is provided by the parasitic inductance of the bond wire. If this inductance is high enough the other inductors $L_1$ and $L_3$ are not necessary. In most cases, however, the parasitic inductance $L_3$ will be insufficient so that $L_1$ or $L_3$ will be added.

In the preferred embodiment, the additional inductance is provided by a discrete component inductor $L_1$ coupled to the PCB between package pin 379 and signal line 302. For example, a surface mount device could be used. Alternatively, or additionally, a integrated circuit inductor $L_3$ could be provided. It is preferable to use as small a component as possible in order to conserve chip area.

Signal line 302 is shown connecting output pad 377 to the input pad 380 of another integrated circuit 371. While illustrated with only two ICs, it should be understood that signal line 302 may comprise a signal bus which couples many ICs.

FIG. 26b has been drawn to illustrate two signal lines 302 and 302'. As is known, an integrated circuit can have many output or (input/output) pins. Some or all of these may include the driver circuitry discussed herein.

Returning to FIG. 26a, the operation of the circuit will be discussed. Assume switch 306 is initially open (i.e., in a high impedance state) and the data line 302 is in the LOW state (e.g., at a potential of about 0 volts). In order to switch line 302 to the HIGH state, switch 306 is closed (i.e., put into a low impedance state), thereby connecting inductor 304 to virtual ground node 307. At that moment an LC circuit is created, with inductor 304 providing the inductance L, and with capacitor 301 providing the capacitance C. Inductor 304 will inject current in the line capacitance 301 and, hence, into the connected line 302.

In the ideal case with no impedance, when switch 306 remains closed the voltage at node 308 will oscillate forever between 0V and $V_{CC}$. The goal of this circuit is to switch to the HIGH voltage level and to stay there. To accomplish this goal, switch 306 should be opened when the voltage signal at node 308 has completed half of one complete period, i.e., at the moment the voltage at node 308 has reached its maximum.

Figure 3:
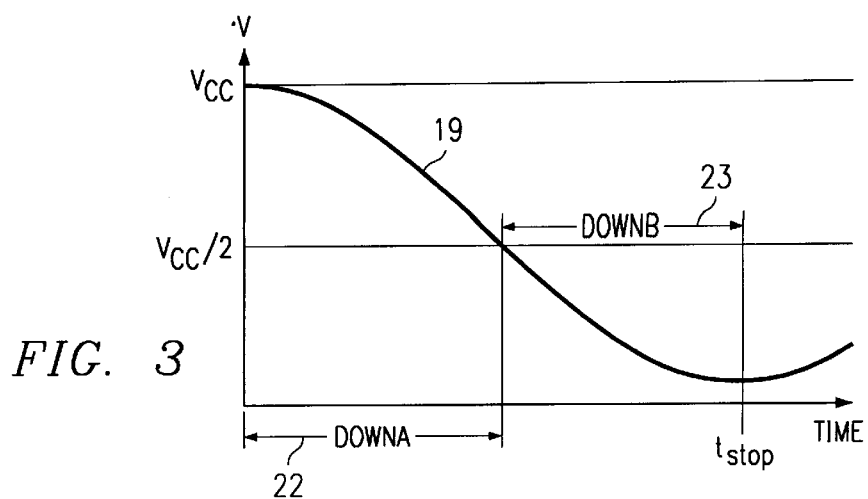
FIG. 3 is a timing diagram showing voltage on common node 17 of FIG. 1 when switching from a HIGH to LOW state.

The curves illustrated in FIG. 2 and FIG. 3 apply to the operation of the circuit in FIG. 26a. As discussed above, the circuit of FIG. 26 cannot be built with completely lossless elements and therefore losses due to non-ideal elements must be compensated. As shown in FIG. 2, the maximum voltage at the peak of the curve is less than $V_{CC}$ by a small loss in energy, reflected by $V_{LOST}$. The voltage $V_{LOST}$ and time $t^{stop}$ can be approximated by the following calculations $$V_{LOST} \approx V_{CC} \frac{\pi}{4} R_s \sqrt{\frac{C_{Line}}{L}} \qquad (3)$$

In these equations, resistance $R_S$ includes all series resistance from virtual ground node 307 to the end of line 302. These resistance values include the resistance of the closed switch 306, the line 302 resistance itself (for lossy lines), the resistance of inductor 304, and any other factors which effect the series resistance. The capacitance 301 of the line ($C_{LINE}$) includes all connected capacitances to the line including, for example, capacitance added by the ESD-protection circuit (not shown). The inductance L is the value of self-inductance 304.

No further elements are necessary if the system can compensate for the voltage loss $V_{LOST}$. For example, if the logic level threshold voltage is $V_{CC}/2$ and $V_{LOST}$ is only 20% of $V_{CC}$, the receiver will see the result as a HIGH-voltage level and no errors will occur. If the receiver includes an input buffer which returns the HIGH to the full voltage level of $V_{CC}$, then no additional circuitry will be necessary.

If, however, the voltage level is not compensated, the next signal transmission will begin from a lower HIGH-voltage level (namely, $V_{CC}-V_{LOST}$). When the circuit is once again switched an extra $V_{LOST}$ will be accumulated. (When you switch from the HIGH level, the capacitor goes to the LOW level, thereby creating an extra $V_{LOST}$. So, the HIGH voltage level will decrease by two times $V_{LOST}$.) In this manner, the capacitive energy on the line will lower after more switching cycles. This problem can be compensated by a snap system which retains the line 302 at its most recent voltage level, with low impedance. At power-up, the snap system can be used to initialize the line to a logic level.

Figure 27:
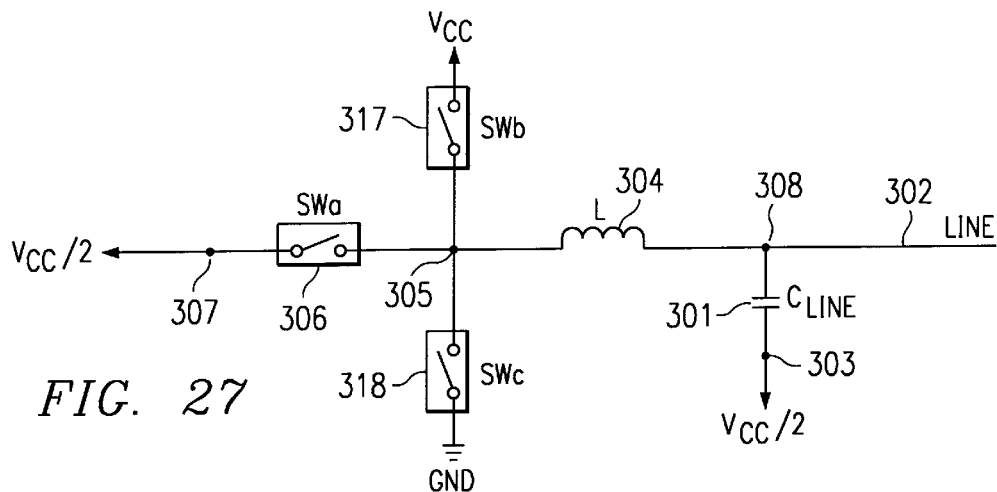
FIG. 27 is a schematic diagram of the preferred voltage switching circuit of FIG. 26 with the addition of snap circuits.

FIG. 27 illustrates the switching circuit of FIG. 26 but with the addition of a first preferred snap system. The snap system comprises switch 317 (labeled SWb) and switch 18 (labeled SWc). These switches 317 and 318 are coupled between node 305 and to $V_{CC}$ or GND, respectively. In the preferred embodiment, switches 317 and 318 comprise MOS transistors but other elements (e.g., bipolar transistors, transmission gates) could alternatively be used. Additional switches (not shown) that snap the line 302 at other allowed levels can also be connected to node 308. For clarity, however, the following description assumes that the snap system consists of switches 317 and 318, both connected to node 305.

Between voltage level transitions, switch 306 is left open. The line capacitance $C_{LINE}$ is charged and the voltage at node 308 remains at whichever logic level is selected. A number of factors can cause the line 302 to drift from the selected level. These factors include leaks, electromagnetic pick-up, cross-talk and others. It is therefore desirable to clamp the line 302 at its selected voltage level by closing one of the switches 317 or 318 when the circuit has completed half of one complete period, i.e. at the moment the voltage at node 308 has reached its maximum or minimum.

Figure 28:
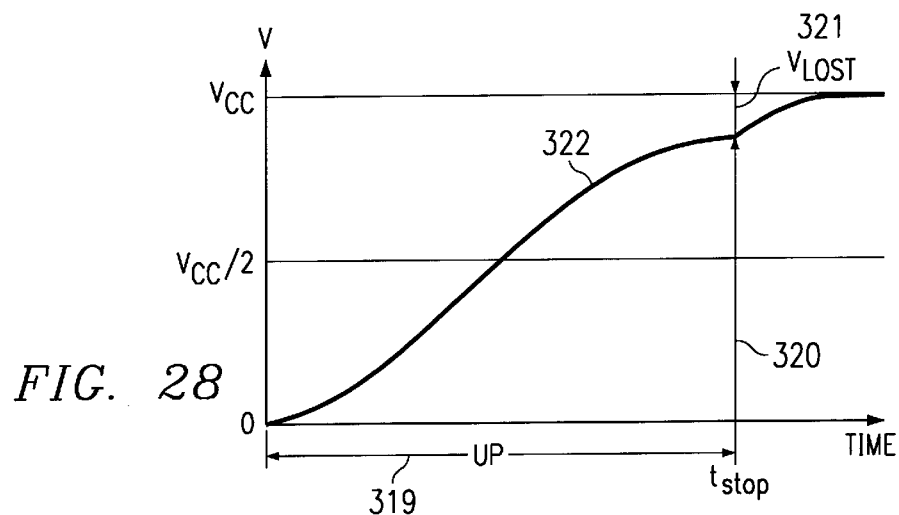
FIGS. 28 and 29 are timing diagrams showing an output voltage of the circuit of FIG. 27.

FIG. 28 illustrates this technique for an upward switching line. During the time period UP (equivalent to $UP_a$ and $UP_b$ in FIG. 2), switch 306 is closed while switches 317 and 318 are open. Leaving the switches 317 and 318 closed during this time period would conflict with the energy recycling principle of this invention and would not result in as low an operating power. At time $t_{stop}$, switch 306 is opened and switch 317 is closed to snap node 308 the rest of the way to $V_{CC}$. The resistance of the closed switch 317 is preferably designed to snap the line with enough force to allow for high speed operation, but such that the voltage on node 308 is sufficiently damped. The damping is necessary to avoid oscillations in the RLC circuit mainly formed by the on-resistance of switch 317, inductance 304 and capacitance 301. Additionally, the snap system prevents the voltage on node 305 from oscillating wildly.

Figure 29:
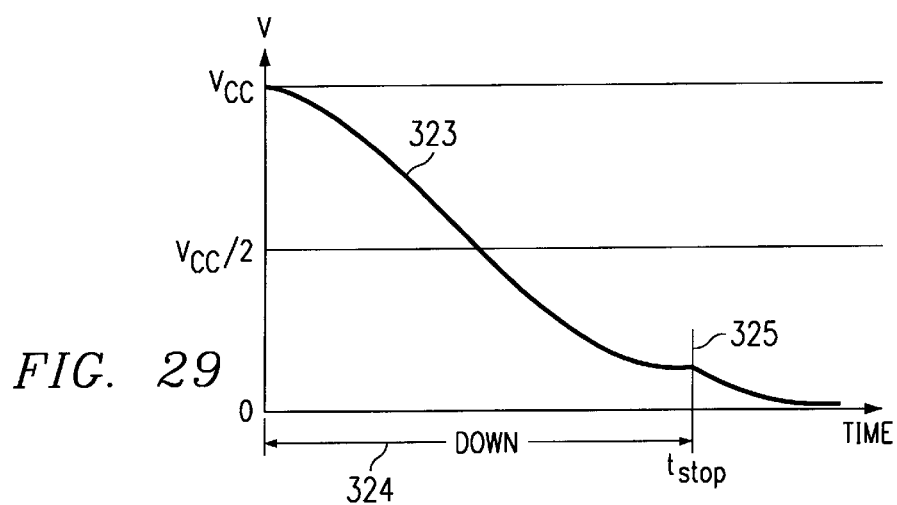

FIG. 29 illustrates the operation of the snap system for a downward switching line. During the voltage level transition period DOWN, only switch 306 is closed. At time $t_{stop}$, switch 306 is opened and switch 318 closed to snap node 308 to the ground potential GND. As before, the on-resistance of switch 318 should also be designed so that the voltage on node 308 is snapped with enough force to reach the desired level without causing oscillations between voltage levels.

Figure 30:
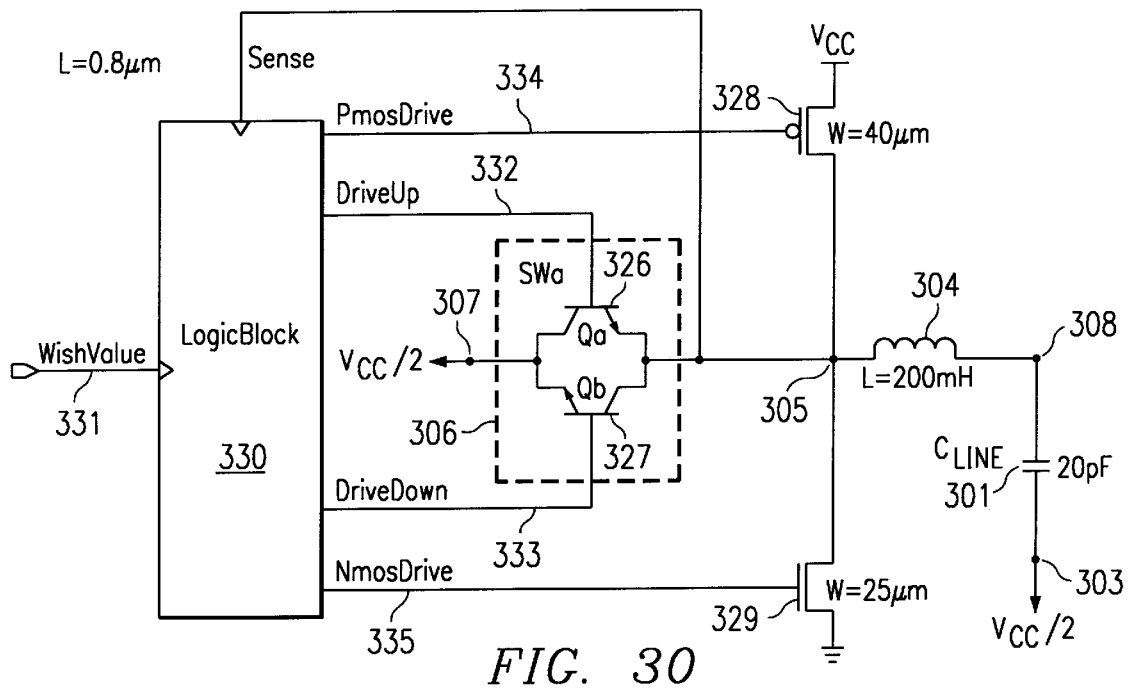
FIG. 30 is a schematic diagram of a particular voltage switching circuit.

The switches 306, 317 and 318 can be made in CMOS, BiCMOS or with other technologies. FIG. 30 shows the circuit of FIG. 27 implemented in BiCMOS technology. In this example bipolar transistors 26 and 27 form switch 306. Node 308 is driven upward via transistor 326 and downward via transistor 327. The bipolar transistors used in the preferred embodiment are configured to be conductive for positive $V_{CE}$, where $V_{CE}$ is the voltage between the collector and the emitter. It is has been found that the performance of bipolar transistors used in reversed mode (emitter and collector interchanged) is inferior.

In the illustrated embodiment, the collector of transistor 326 is connected to node 307, its emitter to node 305. When the voltage of node 305 is lower than the voltage of node 307, which is the case for an upcharging line, transistor 326 will be conductive if base current is injected. When the voltage on node 308 reaches its maximum, current will tend to flow back from node 308 to Vcc/2 via inductor 304 and transistor 326 to discharge capacitor 301. The voltage of node 307 will go lower than the voltage of node 305. At that moment, the voltage $V_{CE}$ of transistor 326 is negative, having been naturally forced in its reverse region.

Also in the illustrated embodiment, the collector of transistor 327 is connected to node 305, its emitter to node 307. Therefore, capacitor 301 will be discharged via transistor 327.

A MOS or CMOS transmission gate could alternatively be used for switch 306. The illustrated circuit with bipolar transistors is just one example of different possible embodiments.

Switch 317 is designed with PMOS transistor 328 and switch 318 with NMOS transistor 329. In the illustrated embodiment, transistor 328 has a gate length of about 0.8 $\mu$m and a gate width of about 40 $\mu$m while transistor 329 has a gate length of about 0.8 $\mu$m and a gate width of about 25 $\mu$m. In this example, the emitter-length of transistors 326 and 327 is about 0.8 $\mu$m and the emitter-width is about 42 $\mu$m.

Control circuit 330 is provided to control the different parts of the driving circuit and to generate the required control signals. Control circuit 330 will be described in greater detail below with respect to FIGS. 32–34.

Figure 31:
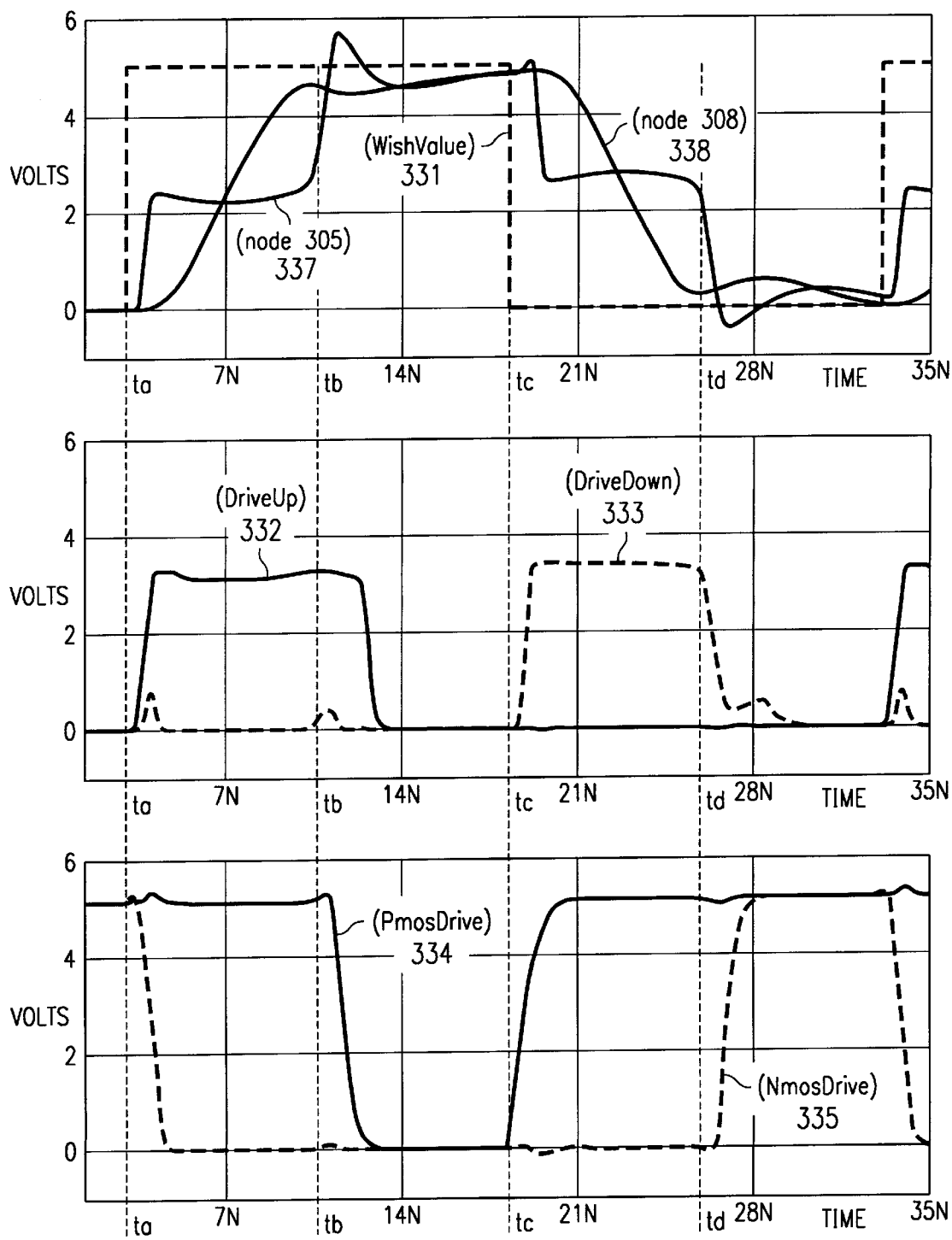
FIG. 31 is a timing diagram of relevant signals for the circuit of FIG. 30.

FIG. 31 illustrates the timing for one transition cycle of a data line 302 with a driver circuit as in FIG. 30. The curves illustrated in FIG. 31 are summarized in Table 1.

TABLE 1

| Voltage Node | Ref. Num. | Label |
| --- | --- | --- |
| Input | 331 | Wishvalue |
| Output of Switch 306 | 337 | Node 305 |
| Line Voltage | 338 | Node 308 |
| Input to Transistor 326 | 332 | DriveUp |
| Input to Transistor 327 | 333 | DriveDown |
| Input to Transistor 328 | 334 | PMOSDrive |
| Input to Transistor 329 | 335 | NMOSDrive |

In this example, the voltages at node 308 and input 31 are initially at ground (zero volts in this example). Both bias voltages 332 and 333 are low so that switch 306 is open. Both drive voltages 334 and 335 are high so that the line capacitance $C_{LINE}$ is clamped to zero volts by transistor 329.

At time ta the input voltage 331 switches HIGH. In response, control circuit 30 pushes NMOS drive signal 335 LOW thereby turning off transistor 329 (i.e., opening the switch 318). Drive Up transistor 332 is driven upward such that base current is injected in transistor 326, hence connecting node 308 to virtual ground ($V_{CC}/2$ in this example). Current is injected from $V_{CC}/2$ to node 308 via transistor 326 and inductor 304, thereby charging up capacitor 301.

At time tb the voltage on node 308 reaches its maximum. As current tends to flow back from node 308 to $V_{CC}/2$ via inductor 304 and transistor 326 in order to discharge capacitor 301, the collector-emitter voltage $V_{CE}$ of transistor 326 becomes negative. This current naturally forces transistor 326 in its reverse region. As a result, node 308 is automatically disconnected from $V_{CC}/2$ and its voltage goes HIGH. This rise in voltage at node 308 is sensed by control circuit 330 which pulls Drive Up voltage 332 downward causing transistor 326 to cut off. At about that time PMOS Drive voltage 334 is forced to LOW to snap the voltages on nodes 305 and 308 to about 5 volts via transistor 329.

At time tc the input voltage 331 goes LOW. In response, control circuit 30 forces PM( Drive voltage 334 HIGH, thereby cutting off transistor 328. Drive Down voltage 333 is drive, upward such that base current is injected in transistor 327, hence connecting node 305 to $V_{CC}/2$. Current is injected from node 308 to $V_{CC}/2$ via inductor 304 and transistor 327, thereby discharging capacitor 301.

At time td the voltage on node 308 reaches its minimum. As current tends to flow back from $V_{CC}/2$ to node 308 via transistor 327 and inductor 304 to charge up capacitor 301, transistor 327 is naturally forced in its reverse region. As a result, node 305 is automatically disconnected from $V_{CC}/2$ and its voltage goes LOW. This decrease in voltage is sensed by control circuit 330 which pulls Drive Down voltage 333 downward causing transistor 327 to completely cut off. NMOS Drive voltage 335 is forced to 5V to snap the voltages on nodes 305 and 308 to zero volts via transistor 328.

Figure 32:
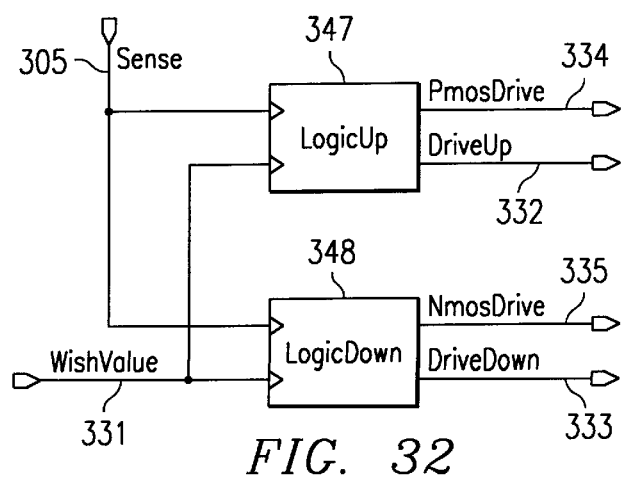
FIG. 32 is a block diagram of the control circuit of FIG. 30.

FIG. 32 shows a preferred embodiment of control circuit 330 (LogicBlock). This circuit is shown in two blocks: LogicUp circuit 347 and LogicDown down 348. Preferred embodiments of these two blocks are given in FIG. 33 and FIG. 34, respectively. A person skilled in the art can easily understand these circuits and will readily recognize several alternative configurations that can be used as a matter of design choice.

Figure 33:
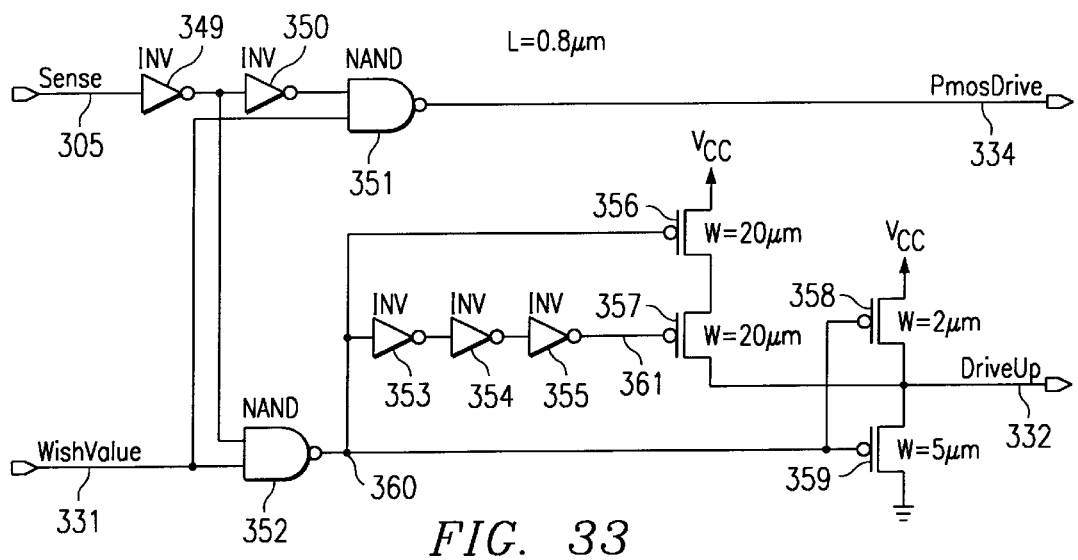
FIGS. 33 and 34 are schematic diagrams of portions of the control circuit of FIG. 32.
Figure 34:
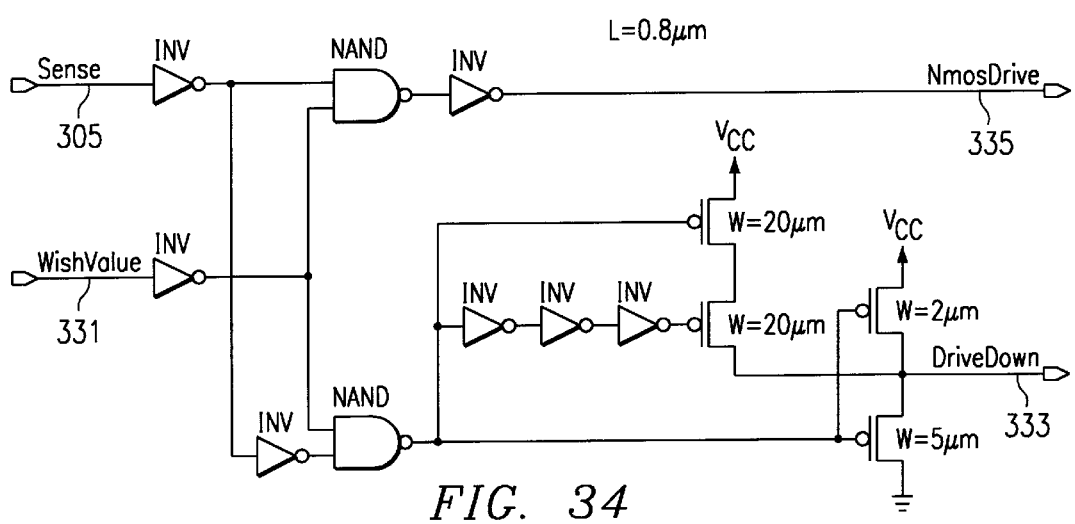

Turning now to FIG. 33 along with FIGS. 30 and 31, the LogicUp circuit 347 will be considered with respect to an operational example. Suppose the input signal 331 and the sense signal 337 on node 305 are LOW. The NAND-gate 351 outputs a logic HIGH signal so that PMOS Drive signal 334 is in the HIGH state and transistor 328 of FIG. 30 is off.

Since NAND-gate 352 outputs a logic HIGH signal at node 360, transistors 356 and 354 are cut off. Transistor 359 is conducting, thereby extracting base current so that bipolar transistor 326 is cut off. Inverter 355 outputs a logic LOW signal at node 361 which causes PMOS transistor 357 to be conductive.

When input signal 331 goes HIGH (at time ta of FIG. 31) and sense signal 337 at node 305 stays LOW, the NAND-gate 352 outputs logic LOW signal at node 360. Since inverters 353, 354 and 355 generate a delay, the voltage on node 361 will remain LOW for a time and a large base current will be injected in transistor 326 through transistors 356, 357 and 358. This relatively large base current allows transistor 326 to charge rapidly. One role of inverters 353, 354, 355 and transistors 356, 357, 358 is to switch bipolar transistor 326 rapidly while minimizing power consumption.

After a brief time (determined by the delay from inverters 353, 354 and 355), the output of inverter 355 becomes HIGH so that only transistor 358 injects the (lower) necessary base current. At time tb, sense signal 337 at node 305 will go to a logic HIGH causing NAND-gate 352 to output a logic HIGH signal at node 360. This HIGH signal causes transistor 358 to turn off and transistor 359 to turn on thereby cutting off transistor 326. When both sense signal 337 at node 305 and input signal 331 are HIGH, the NAND-gate 351 outputs a logic LOW signal at PMOS Drive voltage 334 so that transistor 328 is conducting.

When input signal 331 switches to the LOW state at time tc, PMOS Drive signal 334 goes LOW, thereby unlocking node 305 from $V_{CC}$.

The principles of LogicDown circuit 348 are the same as that of LogicUp circuit 347. Since a person of ordinary skill in the art will easily understand the particular circuit of FIG. 34 with the explanation of FIG. 33, the explanation will not be repeated.

The drive circuits described herein can also be used when the line gets a transmission line character without any need of a termination resistance. When the pulse width is longer then the round trip delay, the transmission line will be automatically charged to the allowed HIGH 20 (e.g., Vcc) or LOW (e.g., ground) voltage level in the open transmission line scheme.

According to the line getting more a (mainly LC-) transmission line character instead of a capacitive one, the inductance, which recycles capacitive energy, might be lowered. When the transmission line model becomes dominant, the external inductance could even be removed, thereby connecting the line directly to node 305 of FIG. 26.

With the drive circuits of the present invention, the incident energy will be reflected at the line-end of the transmission line, hence automatically switching the line to the allowed HIGH or LOW voltage level. This allows avoiding dissipation in termination resistances, hence minimizing the power consumption when switching the line.

Simultaneous switching of multiple lines causes ground bounce with conventional driver circuits due to parasitic inductances. Under- and overshoots outside the allowed voltage swing occur in either the power supply lines (e.g., 3.3 volts or 5 volts) or the ground lines (referred to as power lines). On many integrated circuits, a large number of input/output (I/O) pins are used for power and ground leads. This insures a low inductance path to the power supply lines and hence reduces ground bounce.

With the circuits and methodology of the present invention, the ground bounce can be minimized without using a large number of I/O pins for supply pads. The number of supply pins can typically be reduced by five times compared to integrated circuits with conventional drivers. In the embodiment of FIG. 26a for instance, the inductance 304 is part of the principles of the invention. By connecting the line 302 to the reference voltage node 307 via switch 306 and inductance 304, no under- or overshoots outside the allowed voltage can occur Therefore, the noise in the power lines is reduced.

Figure 35:
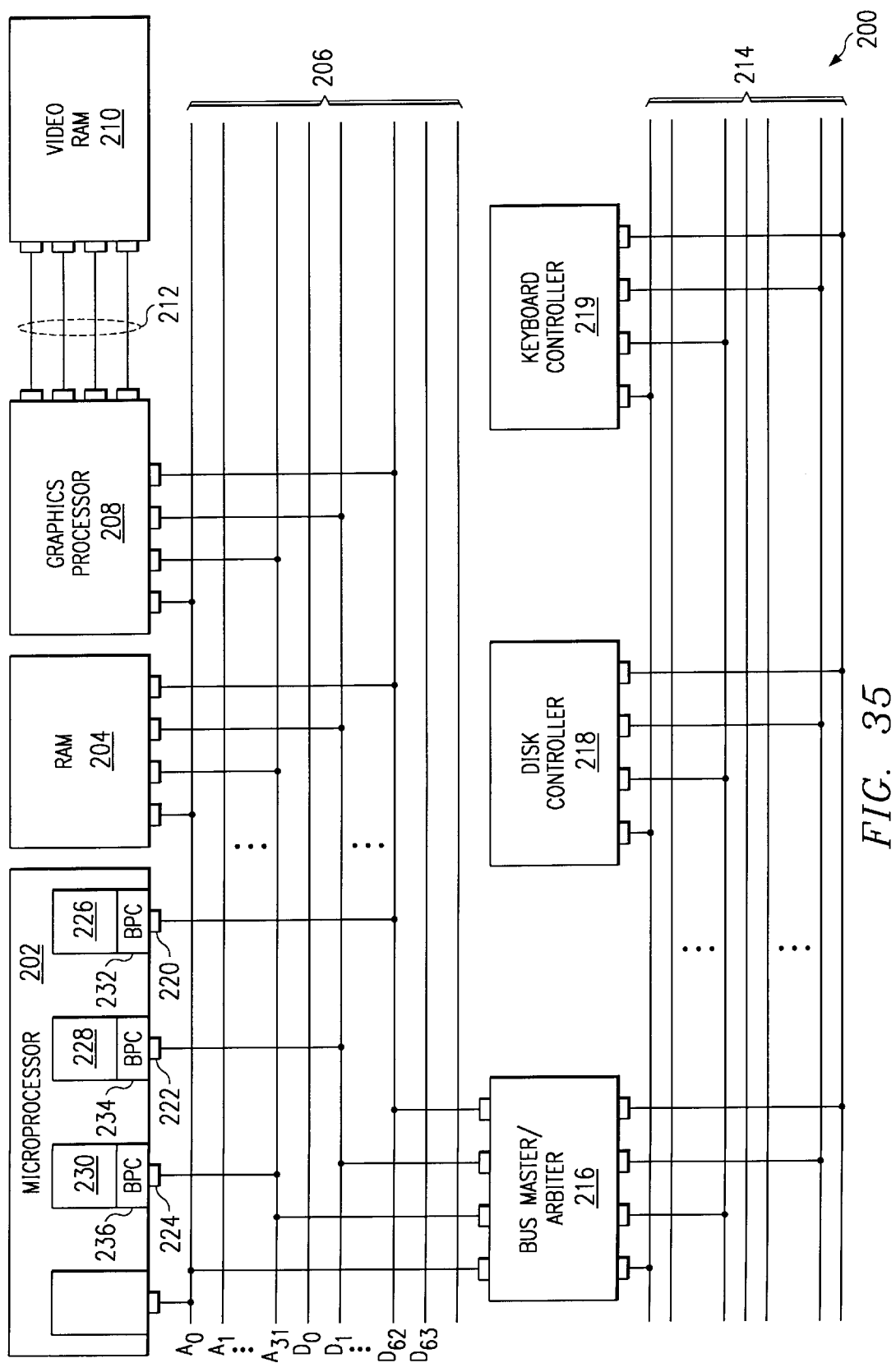
FIG. 35 is a block diagram of a computer system which utilizes the present invention.

As an example, consider the driver circuit of the present invention implemented in a microprocessor (e.g., such as processor 202 in FIG. 35). A typical microprocessor includes many power pins. For example, Pentium Pro™ processor manufactured by Intel includes 76 power supply ($V_{CC}$) pins and 101 ground ($V_{SS}$) pins. With the present invention, the number pins could be greatly reduced. For example, a microprocessor operating at internal clock speeds over 100 MHz could use twenty-five or less ground pins.

The switching circuits described herein can be used in a variety of contexts. For example, the preferred embodiment could be implemented in the bus driving circuitry of a processor (e.g., microprocessor, digital signal processor), a controller (e.g., a peripheral or graphics controller, a memory controller), a memory device (e.g., DRAM, SRAM, non-volatile), an application specific integrated circuit (ASIC), or other device that communicates data, address or control signals through a bus such as an ISA, PCI, VL, SCSI or other well known bus architecture. In that instance, data line 302 would represent a signal line on the bus through which the device communicates. This data line 302 is connected to the bus driving circuitry of the present invention through the I/O pins of the device as is well known in the art.

The switching circuit of the present invention is especially useful in situations where low power is required. For example, portable computers typically operate from battery power and typically do not include a fan. Therefore, it is desirable to limit the power consumption and corresponding heat generation. This same goal applies to telecommunication devices such as cellular telephones and pagers and other devices such as organizers. While especially useful in portable devices, the present invention could also be used in other devices such as personal computers, servers, televisions, and others.

As an example, FIG. 35 illustrates a computer system (e.g., personal computer) incorporating a bus driver circuit BDC embodying the invention, for example the bus driver circuitry shown in FIG. 7 or FIG. 27. Only some of the components of the personal computer that are relevant to an understanding of the preferred embodiments are shown. The personal computer 200 of FIG. 35 includes a microprocessor 202 connected to system RAM 204, via a local bus 206. Personal computer 200 also includes a, graphics processor 208 connected to video RAM 210 via video bus 212. Microprocessor 202 also communicates with a system bus 214 via bus master/arbiter 216. Peripheral devices, such as disk controller 218 and keyboard controller 219 are connected to system bus 214. System bus 214 transmits data, addresses and instructions between peripherals 218, and bus master 216, which in turn communicates data, addresses and instructions with microprocessor 202 and system RAM 204 via local bus 206. System bus 214 is preferably an Industry Standard Architecture (ISA) bus, Peripheral Component Interface (PCI) bus or other well known industry standard bus. Video bus 212 communicates addresses, data and instructions between graphics processor 208 and video RAM 210 and is preferably a VL bus or other well known local bus architecture. Local bus 206 includes address lines A0 through A31, data lines D0 through D63, and various other control lines. Microprocessor 202 is connected to local bus 206 via I/O terminals 220, 222 . . . 224, which terminals are connected to I/O circuitry 226, 228 . . . 230, respectively.

For clarity, only a few representative I/O terminals and associated I/O circuitry are shown. It will be apparent to one skilled in the art that the teachings of the preferred embodiment would apply to each I/O terminal of any electronic device such as microprocessor 202, graphics processor 208, bus master/arbiter 216, RAM 204, and the like, that communicates information over any one of buses 206, 212, 214, or any comparable data bus.

Using microprocessor 202 as an example, internal logic circuitry of microprocessor 20 generates address, data, and control signals to be output on local bus 206. These signals are communicated to I/O circuitry 226, 228 . . . 230. I/O circuitry 226, 228 . . . 230 includes date latches and buffers as is well known in the art. Additionally, I/O circuitry 226, 228 . . . 230 includes low power bus driving circuitry BDC 232, 234, 236, respectively as described in del below. Only connections to address lines A0 and A31 and data lines D1 and D62 are shown, for clarity. It will be apparent that each line on the bus will have associated with it I/O terminals and I/O circuitry. It should also be noted that throughout the specification the terms data bus and data line refer generically to any bus and lines used to communicate signals between electronic devices in a system, including address signals, data or information signals, control signals and the like. The I/O circuitry conditions the signals received from the internal logic circuitry for applying the signals on the bus and drives the bus data lines to the desired signal levels.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A drive circuit comprising:
  an output terminal;
  a reference voltage node;
  an inductor coupled between the output terminal and the reference voltage node;
  a switch coupled between the output terminal and the reference voltage node, the switch coupled so that when the switch is closed a series circuit is formed between the reference voltage node, the inductor and the output terminal, the switch also coupled so that when the switch is open a series circuit is prevented from being formed between the reference voltage node, the inductor and the output terminal; and
  a snap circuit, the snap circuit including an output coupled to the output node.

2. The circuit of claim 1 wherein the switch is coupled between the inductor and the signal line.

3. The circuit of claim 1 wherein the switch is coupled between the reference voltage node and the inductor.

4. The circuit of claim 1 wherein the switch is formed on an integrated circuit which is mounted on a printed circuit board, and wherein the inductor is outside the integrated circuit and also mounted to the printed circuit board.

5. The circuit of claim 1 wherein the reference voltage node comprises a virtual ground node, the virtual ground node being held at a voltage level between a High voltage level and a Low voltage level.

6. The circuit of claim 1 wherein the switch comprises a transistor.

7. The circuit of claim 6 wherein the switch comprises a bipolar transistor.

8. The circuit of claim 6 wherein the switch comprises at least two transistors coupled in parallel.

9. The circuit of claim 6 wherein the switch comprises a CMOS transmission gate.

10. The circuit of claim 1 and further comprising a control circuit with an output coupled to a control input of the switch, the control circuit closing the switch for a duration of time in response to an output signal.

11. The circuit of claim 1 wherein the output terminal is coupled to a signal line.

12. The circuit of claim 11 wherein the signal line comprises one line of a signal bus.

13. The circuit of claim 12 wherein the signal bus comprises a signal bus of a portable computer.

14. A method of switching a line from a first voltage level to a second voltage level, the method comprising the steps of:
  coupling the line to an inductor;
  inductively coupling the line to a reference voltage at a level between the first and second voltage levels;
  decoupling the line from the reference voltage when the line substantially reaches a maximum bias relative to the reference voltage; and
  after decoupling the line, forcing the line to the second voltage level using a snap circuit.

15. The method of claim 14 wherein the step of inductively coupling occurs in response to a CMOS logic output signal.

16. A switching circuit comprising:
  a first switch with a current path coupled between a virtual ground node and an output node;
  an inductive energy storage element coupled between the virtual ground node and the output node and in series with the first switch;
  a second switch with a current path coupled between a HIGH voltage node and the output node;
  third switch with a current path coupled between a LOW voltage node and the output node; and
  a control circuit with an input, a first output coupled to a control input of the first switch, a second output coupled to a control input of the second switch, and a third output coupled to a control input of the third switch;

wherein, in response to the receipt of an input signal at the input of the control circuit, the control circuit enables the first switch for a selected period of time and, after the selected period of time, disables the first switch and enables only one of the second and third switches.

17. The circuit of claim 16 wherein the virtual ground node is held at a voltage level between the voltage level at the HIGH voltage node and the voltage level at the LOW voltage node.

18. The circuit of claim 17 wherein the virtual ground node is held at a voltage level midway between the voltage level at the HIGH voltage node and the voltage level at the LOW voltage node.

19. The circuit of claim 16 wherein the inductive energy storage element is coupled between the output node and the first switch.

20. The circuit of claim 19 and further comprising a capacitive energy storage element wherein the inductive energy storage element has a current path coupled between the capacitive energy storage element and the output node.

21. The circuit of claim 16 wherein the first switch comprises a transistor.

22. The circuit of claim 21 wherein the first switch comprises a bipolar transistor.

23. The circuit of claim 21 wherein the first switch comprises at least two transistors coupled in parallel.

24. The circuit of claim 16 wherein the second and third switches each comprise a transistor.

25. The circuit of claim 24 wherein the second transistor comprises a PMOS transistor.

26. The circuit of claim 25 wherein the third transistor comprises an NMOS transistor.

27. The circuit of claim 16 wherein the second output of the control circuit provides a control signal which is a logical combination of the signal at the input node and the signal at the output node.

28. The circuit of claim 27 wherein the logical combination is performed with a NAND gate.

29. The circuit of claim 16 wherein, in response to the input signal, the control circuit provides time-varying amounts of the drive current to enable the first switch.

30. A driver circuit for driving high and low voltage levels, the driver circuit comprising:
   a plurality of output terminals;
   a reference voltage node for being held at a voltage level between said high and low voltage levels;
   at least a plurality of switches, each switch coupled to one of said output terminals, each switch coupling its respective output terminal to the reference voltage node when closed;
   at least one inductive energy storage element coupled between said reference voltage node and the plurality of output terminals, the at least one inductive storage element being coupled between the reference voltage node and the switch; and
   control logic coupled to said switches for closing selected switches to start a voltage level transition of output terminal coupled to said selected switches and for opening said selected switches when a voltage level transition from one to the other of said high and low voltage levels is substantially complete.

31. The circuit of claim 30 wherein the at least one inductive energy storage element is commonly coupled to each of the switches.

32. The circuit of claim 31 and further comprising a pump circuit coupled to each of the switches.

33. The circuit of claim 30 wherein the at least one inductive energy storage element comprises a plurality of inductive energy storage elements, each inductive energy storage element coupled between the reference voltage node and a respective one of the output terminals.

34. The circuit of claim 33 wherein each inductive energy storage element is coupled between a respective one of the switches and a respective one of the output terminal.

35. The circuit of claim 30 further comprising current detecting circuitry coupled to the driver circuit for signaling said control logic when voltage across said inductive energy storage element equals zero.

36. The circuit of claim 30 wherein the reference voltage node is held at a voltage level intermediate said high and low voltage levels.

37. The circuit of claim 30 wherein the plurality of output terminals are connected to signal lines of a signal bus.

38. A driver circuit for driving high and low voltage levels, the driver circuit comprising:
   a plurality of output terminals;
   a reference voltage node for being held at a voltage level between said high and low voltage levels;
   at least a plurality of switches, each switch coupled to one of said output terminals each switch coupling its respective output terminal to the reference voltage node when closed;
   at least one inductive energy storage element coupled between said reference voltage node and the plurality of output terminals, the at least one inductive storage element being coupled between the reference voltage node and the switch; and
   control logic coupled to said switches for closing selected switches to start a voltage level transition of output terminal coupled to said selected switches and for opening said selected switches when a voltage level transition from one to the other of said high and low voltage levels is substantially complete; and
   selection circuitry coupled to said control logic for selecting a first set of data lines to be transitioned from said high to said low level and for selecting a second set of data lines to be transitioned from said low to said high level;
   wherein said control logic closes a first set of selected switches simultaneously to start a first voltage level transition on said first set of data lines and opens said first set of selected switches simultaneously when said first voltage level transition on said first set of data lines is substantially complete; and
   wherein said control logic closes a second set of selected switches simultaneously to start a second voltage level transition on said second set of data lines and opens said second set of selected switches simultaneously when said second voltage level transition on said second set of data lines is substantially complete.

39. A driver circuit for driving high and low voltage levels, the driver circuit comprising:
   a plurality of output terminals;
   a reference voltage node for being held at voltage level between said high and low voltage levels;
   at least a plurality of switches, each switch coupled to one of said output terminals, each switch coupling its respective output terminal to the reference voltage node when closed;
   at least one inductive energy storage element coupled between said reference voltage node and the plurality of output terminals, the at least one inductive storage element being coupled between the reference voltage node and the switch; and control logic coupled to said switches for closing elected switches to start a voltage level transition of output terminals coupled to said elected switches and for opening sid selected switches when a voltage level transition from one to the other of said high and low voltage levels in substantially complete; and a plurality of snap circuits, each snap circuit coupled to one output terminal for pulling a connected signal line to the nearest of said high and low voltage levels, wherein the snap circuit is decoupled from said output terminal during a voltage level transition.

40. A method of driving a plurality of lines between different voltage levels the method comprising:

selecting a first set of lines that are currently at a first voltage level and are to be driven to a second voltage level;

converting capacitive energy stored with a first charging direction on said first set of data lines into magnetic energy;

converting said magnetic energy into capacitive energy on said first set of data lines with a charging direction opposite from said first charging direction relative to a reference voltage intermediate said first and second voltage levels;

selecting a second set of data lines that are currently at said second voltage level and are to be driven to said first voltage level;

converting capacitive energy stared with said second charging direction on said second set of data lines into additional magnetic energy; and converting said additional magnetic energy into capacitive energy on said second set of data lines with a charging direction opposite from said second charging direction relative to a reference voltage intermediate said first and second voltage levels.

41. The method of claim 40 in which said steps of converting capacitive energy stored on said first set of data lines and converting capacitive energy stored on said second set of data lines occur substantially simultaneously; and said steps of converting said magnetic energy and converting said additional magnetic energy occur substantially simultaneously.

42. A system for driving signals across a data bus comprising:

a data bus for communicating signals between devices said data bus including data lines having capacitance;

a bus driver coupled to said data bus, said bus driver including:

a switch for coupling a data line of said data bus to inductive means for establishing an LC circuit including said inductive means and said capacitance of said data line when said switch couples said data line and said inductive means;

control means for closing said switch to initiate a voltage level transition on said data line and for opening said switch when said LC circuit is substantially near one half period of its resonant oscillation.

43. The system of claim 42 wherein said data bus communicates signals as a series of allowed voltage levels and further including:

snap circuitry coupled to said data line for snapping the voltage on said data line to the nearest allowed voltage level or to a high impedance;

pump circuitry for injecting current into said data line when said data line has a voltage level within a first pre-determined range of a first allowed voltage level and for extracting current from said data line when said data line has a voltage level within a second pre-determined range of a second allowed voltage level.

44. A system for driving signals across a data bus comprising:

a data bus for communicating signals between devices said data bus including data lines having capacitance;

a bus driver coupled to said data bus, said bus driver including:

a first switch for coupling a first data line of said data bus to first inductive means for establishing a first LC circuit including said first inductive means and said capacitance of said first data line when said first switch couples said first data line and said first inductive means;

a second switch for coupling a second data line of said data bus to second inductive means for establishing a second LC circuit including said second inductive means and said capacitance of said second data line when said second switch couples said second data line and said second inductive means;

first control means for closing said first switch to initiate a first voltage level transition on said first data line and for opening said first switch when said first LC circuit is substantially near one half period of its resonant frequency;

second control means for closing said second switch to initiate a second voltage level transition on said second data line and for opening said second switch when said second LC circuit is substantially near one half period of its resonant oscillation.

45. The system of claim 44 further comprising means for dissipating energy from said first a second inductive means when said first and second data lines are not coupled to said first and second inductive means.

46. The system of claim 44 wherein said data bus communicates signals as a series of allowed voltage levels and further including:

first snap circuitry coupled to said first data line for snapping the voltage on said first data line to the nearest allowed voltage level or to a high impedance;

second snap circuitry coupled to said second data line for snapping the voltage on said second data line to the nearest allowed voltage level or to a high impedance;

first pump circuitry for injecting current into said first data line when said first data line has a voltage level within a first pre-determined range of a first allowed voltage level and for extracting current from said first data line when said first data line has a voltage level within a second pre-determined range of a second allowed voltage level; and second pump circuitry for injecting current into said second data line when said second data line has a voltage level within said first pre-determined range of said first allowed voltage level and for extracting current from said second data line when said second data line has a voltage level within said second pre-determined range of said second allowed voltage level.

47. The system of claim 44 wherein said first inductive means and said second inductive means are closely coupled.

48. The system of claim 44 wherein said first and second control means close said first and second switches, respectively, substantially simultaneously with each other and open said first and second switches respectively, substantially simultaneously with each other.

49. The system of claim 44 wherein said first and second inductive means comprise wound wire coupled to said data bus.

* * * * *